(12) United States Patent
Prasad et al.

(10) Patent No.: US 12,431,881 B1
(45) Date of Patent: Sep. 30, 2025

(54) SELF-CALIBRATION OF DELAY CIRCUITS IN ASYNCHRONOUS LOOPS

(71) Applicant: QUALCOMM Incorporated, San Diego, CA (US)

(72) Inventors: Shashank Rajendra Prasad, San Diego, CA (US); Patrick Isakanian, El Dorado Hills, CA (US)

(73) Assignee: QUALCOMM INCORPORATED, San Diego, CA (US)

( * ) Notice: Subject to any disclaimer, the term of this patent is extended or adjusted under 35 U.S.C. 154(b) by 39 days.

(21) Appl. No.: 18/623,657

(22) Filed: Apr. 1, 2024

(51) Int. Cl.
*H03K 5/133* (2014.01)
*H03M 1/50* (2006.01)
*H03K 5/00* (2006.01)

(52) U.S. Cl.
CPC ............ *H03K 5/133* (2013.01); *H03M 1/502* (2013.01); *H03K 2005/00247* (2013.01)

(58) Field of Classification Search
None
See application file for complete search history.

(56) References Cited

U.S. PATENT DOCUMENTS 7,196,526 B2 * 3/2007 Vincent ................. G04F 10/005
341/120

* cited by examiner

*Primary Examiner* — Cassandra F Cox
(74) *Attorney, Agent, or Firm* — Loza & Loza, LLP

(57) ABSTRACT

A calibration circuit has a delay loop, a counter and a latch. The delay loop that includes a delay circuit. The counter is clocked by edges in a clock signal generated by the delay loop when an enable signal is in a first signaling state. The latch is configured to capture a multibit output of the counter when the enable signal transitions to a second signaling state. A number of unit delay elements in the delay circuit are enabled based on the multibit output of the counter. In one example, the number of enabled unit delay elements is based on a difference between the multibit output of the counter and a multibit value expected to be generated when the delay circuit is operating nominally.

20 Claims, 13 Drawing Sheets

1000

Current number of delay elements ($K_{current}$) = 13
Expected Cycles ($M$) = 13

| Observed ($O$) | Scaling ($M/O$) | Raw $K_{cal}$ | $K_{cal}$ |
|---|---|---|---|
| 31 | 13/31 | 5.45 | 6 |
| ⋮ | ⋮ | ⋮ | |
| 25 | 13/25 | 6.76 | 7 |
| ⋮ | ⋮ | ⋮ | |
| 20 | 13/20 | 8.45 | 9 |
| ⋮ | ⋮ | ⋮ | |
| 14 | 13/14 | 12.07 | 12 |
| 13 | 13/13 | 13.00 | 13 |
| ⋮ | ⋮ | ⋮ | |
| 10 | 13/10 | 16.90 | 17 |
| ⋮ | ⋮ | ⋮ | |
| 4 | 13/4 | 42.25 | 43 |

*FIG. 10*

SELF-CALIBRATION OF DELAY CIRCUITS IN ASYNCHRONOUS LOOPS

TECHNICAL FIELD

The present disclosure generally relates to calibrating delay circuits and, more particularly, to calibrating delay circuits in delay loops that produce internal clock signals in an analog-to-digital converter.

BACKGROUND

Electronic device technologies have seen explosive growth over the past several years. For example, growth of cellular and wireless communication technologies has been fueled by better communications, hardware, larger networks, and more reliable protocols. Wireless service providers are now able to offer their customers an ever-expanding array of features and services, and provide users with unprecedented levels of access to information, resources, and communications. To keep pace with these service enhancements, mobile electronic devices (e.g., cellular phones, tablets, laptops, etc.) have become more powerful and complex than ever. Wireless devices may include a high-speed bus interface for communication of signals between hardware components.

IC devices may include a serializer/deserializer (SERDES) to transmit and receive through a communication link. High-speed serial buses offer advantages over parallel communication links when, for example, there is demand for reduced power consumption and smaller footprints in integrated circuit (IC) devices. In a serial interface, data is converted from parallel words to a serial stream of bits using a serializer and is converted back to parallel words at the receiver using a deserializer. SERDES circuits may be included in memory interfaces and/or high-speed bus interfaces such as the Peripheral Component Interconnect Express (PCIe) bus, Universal Serial Bus (USB) or Serial Advanced Technology Attachment (SATA), among others.

Performance, accuracy or reliability of the bus and memory interfaces may depend on the accuracy and reliability of clock signals. The frequency may change due to some combination of process, voltage and temperature variances, and changes in frequency can reduce timing margins and result in errors in capturing (receiving) or transmitting data. For example, degraded timing of clocks signals can result in improper operation of analog-to-digital converters. There is an ongoing need for new techniques that provide reliable clock generation and calibration circuits for components, including locally-generated clock signals.

SUMMARY

Certain aspects of the disclosure relate to systems, apparatus, methods and techniques that can be used to implement self-calibrating delay generating circuits that are used in asynchronous loops. Certain aspects related to reducing errors due to noise and improper settling in circuits associated with an asynchronous loop. According to certain aspects, a self-calibrating delay generating circuit may use digital counter feedback to monitor and adjust delays in an asynchronous loop without significantly disrupting operation of the underlying circuits.

In various aspects of the disclosure, a calibration circuit has a delay loop, a counter and a latch. The delay loop that includes a delay circuit. The counter is clocked by edges in a clock signal generated by the delay loop when an enable signal is in a first signaling state. The latch is configured to capture a multibit output of the counter when the enable signal transitions to a second signaling state. A number of unit delay elements in the delay circuit may be enabled based on the multibit output of the counter.

In various aspects of the disclosure, an apparatus includes means for counting cycles of a clock signal generated by a delay loop that includes a delay circuit. The means for counting cycles of a clock signal generated by the delay loop may include series-connected flipflops clocked by edges in the clock signal. Each flipflop of the series-connected flipflops may provide one bit of a multibit output. The apparatus further includes means for capturing the multibit output, and means for selecting a number of unit delay elements to be enabled in the delay circuit. A number of unit delay elements in the delay circuit are enabled based on the multibit output.

In various aspects of the disclosure, a calibration method includes clocking a counter that using edges in a clock signal generated by a delay loop that includes a delay circuit when an enable signal is in a first signaling state, capturing a multibit output of the counter when the enable signal transitions to a second signaling state and enabling a number of unit delay elements in the delay circuit based on the multibit output of the counter.

In certain aspects, the multibit output of the counter is used to configure an associated delay circuit in a clock generation loop of an analog-to-digital converter.

In one aspect, the number of enabled unit delay elements is based on a difference between the multibit output of the counter and a multibit value expected to be generated when the delay circuit is operating nominally.

In certain aspects, combinational logic may be configured to enable combinations of the unit delay elements based on bit values in the multibit output of the counter. The counter may include series-connected flipflops. Each flipflop of the series-connected flipflops may provide one bit of the multibit output of the counter. A binary value may be propagated through one of the series-connected flipflops in response to each edge in the clock signal. An output of each flipflop of the series-connected flipflops may enable at least one of the unit delay elements when the binary value has been propagated to the output of the each flipflop.

In certain aspects, the multibit output of the counter is captured when the delay loop is operated in a first mode of operation. A comparator may be included in the delay loop when the delay loop is operated in a second mode of operation. An operating characteristic of the comparator may be configured based on the multibit output of the counter.

BRIEF DESCRIPTION OF THE DRAWINGS

FIG. 10 illustrates an example of a lookup table that may be embedded in a delay circuit configured in accordance with certain aspects of this disclosure.

DETAILED DESCRIPTION

Figure 1:
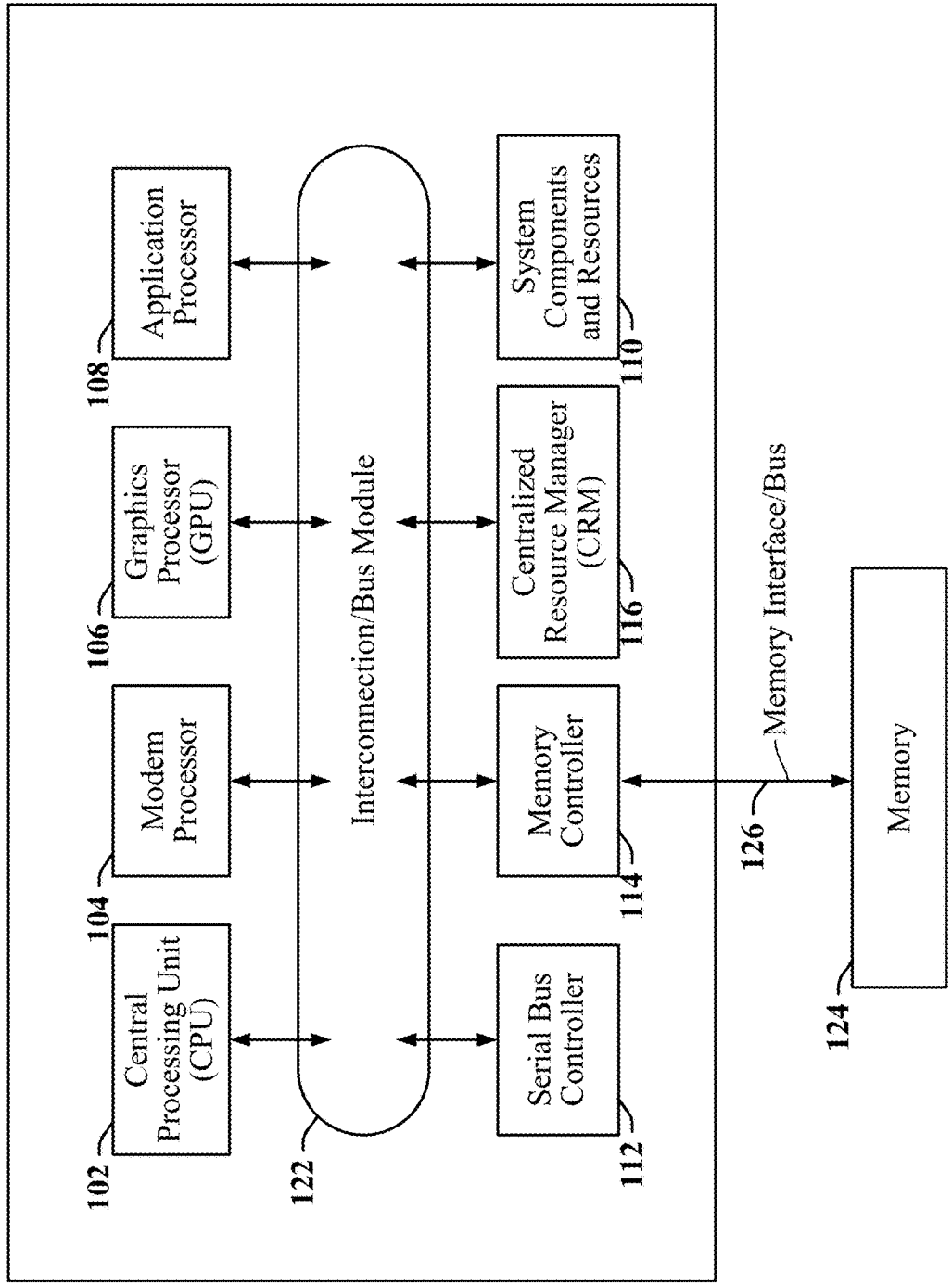
FIG. 1 illustrates an example of a system-on-a-chip in accordance with certain aspects of the present disclosure.

The detailed description set forth below in connection with the appended drawings is intended as a description of various configurations and is not intended to represent the only configurations in which the concepts described herein may be practiced. The detailed description includes specific details for the purpose of providing a thorough understanding of various concepts. However, it will be apparent to those skilled in the art that these concepts may be practiced without these specific details. In some instances, well-known structures and components are shown in block diagram form in order to avoid obscuring such concepts.

With reference now to the Figures, several exemplary aspects of the present disclosure are described. The word "exemplary" is used herein to mean "serving as an example, instance, or illustration." Any aspect described herein as "exemplary" is not necessarily to be construed as preferred or advantageous over other aspects.

The terms "computing device" and "mobile device" are used interchangeably herein to refer to any one or all of servers, personal computers, smartphones, cellular telephones, tablet computers, laptop computers, notebooks, ultrabooks, palm-top computers, personal data assistants (PDAs), wireless electronic mail receivers, multimedia Internet-enabled cellular telephones, Global Positioning System (GPS) receivers, wireless gaming controllers, and similar personal electronic devices which include a programmable processor. While the various aspects are particularly useful in mobile devices (e.g., smartphones, laptop computers, etc.), which have limited resources (e.g., processing power, battery, size, etc.), the aspects are generally useful in any computing device that may benefit from improved processor performance and reduced energy consumption.

The term "multicore processor" is used herein to refer to a single integrated circuit (IC) chip or chip package that contains two or more independent processing units or cores (e.g., CPU cores, etc.) configured to read and execute program instructions. The term "multiprocessor" is used herein to refer to a system or device that includes two or more processing units configured to read and execute program instructions.

The term "system on chip" (SoC) is used herein to refer to a single integrated circuit (IC) chip that contains multiple resources and/or processors integrated on a single substrate. A single SoC may contain circuitry for digital, analog, mixed-signal, and radio-frequency functions. A single SoC may also include any number of general purpose and/or specialized processors (digital signal processors (DSPs), modem processors, video processors, etc.), memory blocks (e.g., read only memory (ROM), random access memory (RAM), flash, etc.), and resources (e.g., timers, voltage regulators, oscillators, etc.), any or all of which may be included in one or more cores.

Memory technologies described herein may be suitable for storing instructions, programs, control signals, and/or data for use in or by a computer or other digital electronic device. Any references to terminology and/or technical details related to an individual type of memory, interface, standard, or memory technology are for illustrative purposes only, and not intended to limit the scope of the claims to a particular memory system or technology unless specifically recited in the claim language. Mobile computing device architectures have grown in complexity, and now commonly include multiple processor cores, SoCs, co-processors, functional modules including dedicated processors (e.g., communication modem chips, GPS receivers, etc.), complex memory systems, intricate electrical interconnections (e.g., buses and/or fabrics), and numerous other resources that execute complex and power intensive software applications (e.g., video streaming applications, etc.).

Process technology employed to manufacture semiconductor devices, including IC devices is continually improving. Process technology includes the manufacturing methods used to make IC devices and defines transistor size, operating voltages and switching speeds. Features that are constituent elements of circuits in an IC device may be referred as technology nodes and/or process nodes. The terms technology node, process node, process technology may be used to characterize a specific semiconductor manufacturing process and corresponding design rules. Faster and more power-efficient technology nodes are being continuously developed through the use of smaller feature size to produce smaller transistors that enable the manufacture of higher-density ICs.

Certain aspects of the disclosure are applicable to serializer/deserializer (SERDES) circuits used to transmit and receive data over a serial communication link. SERDES circuits may be included in certain input/output (I/O) circuits. For example, SERDES circuits may be used in an IC device that provide an interface between core circuits and memory devices. Many mobile devices employ Synchronous Dynamic Random Access Memory (SDRAM), including Low-Power Double Data Rate (DDR) SDRAM, which may be referred to as low-power DDR SDRAM, LPDDR SDRAM or, in some instances, LPDDRx where x describes the technology generation of the LPDDR SDRAM. Later generations of LPDDR SDRAM designed to operate at higher operating frequencies.

FIG. 1 illustrates example components and interconnections in an SoC 100, including a memory interface/bus 126, that may be suitable for implementing certain aspects of the present disclosure. The SoC 100 may include a number of heterogeneous processors, such as a central processing unit (CPU) 102, a modem processor 104, a graphics processor 106, and an application processor 108. Each processor 102, 104, 106, 108, may include one or more cores, and each processor/core may perform operations independent of the other processors/cores. The processors 102, 104, 106, 108 may be organized in close proximity to one another (e.g., on a single substrate, die, integrated chip, etc.) so that the processors may operate at a much higher frequency/clock rate than would be possible if the signals were to travel off-chip. The proximity of the cores may also allow for the sharing of on-chip memory and resources (e.g., voltage rails), as well as for more coordinated cooperation between cores.

The SoC 100 may include system components and resources 110 for managing sensor data, analog-to-digital conversions, and/or wireless data transmissions, and for performing other specialized operations (e.g., decoding high-definition video, video processing, etc.). System components and resources 110 may also include components such as voltage regulators, oscillators, phase-locked loops (PLLs), peripheral bridges, data controllers, system controllers, access ports, timers, and/or other similar components used to support the processors and software clients running on the computing device. The system components and resources 110 may also include circuitry for interfacing with peripheral devices, such as cameras, electronic displays, wireless communication devices, external memory chips, etc.

The SoC 100 may further include a Universal Serial Bus (USB) or other serial bus controller 112, one or more memory controllers 114, and a centralized resource manager (CRM) 116. The SoC 100 may also include an input/output module (not illustrated) for communicating with resources external to the SoC, each of which may be shared by two or more of the internal SoC components.

The processors 102, 104, 106, 108 may be interconnected to the USB controller 112, the memory controller 114, system components and resources 110, CRM 116, and/or other system components via an interconnection/bus module 122, which may include an array of reconfigurable logic gates and/or implement a bus architecture. Communications may also be provided by advanced interconnects, such as high performance networks on chip (NoCs).

The interconnection/bus module 122 may include or provide a bus mastering system configured to grant SoC components (e.g., processors, peripherals, etc.) exclusive control of the bus (e.g., to transfer data in burst mode, block transfer mode, etc.) for a set duration, number of operations, number of bytes, etc. In some cases, the interconnection/bus module 122 may implement an arbitration scheme to prevent multiple master components from attempting to drive the bus simultaneously. The memory controller 114 may be a specialized hardware module configured to manage the flow of data to and from a memory 124 via the memory interface/bus 126.

The memory controller 114 may comprise one or more processors configured to perform read and write operations with the memory 124. Examples of processors include microprocessors, microcontrollers, digital signal processors (DSPs), field programmable gate arrays (FPGAs), programmable logic devices (PLDs), state machines, gated logic, discrete hardware circuits, and other suitable hardware configured to perform the various functionality described throughout this disclosure. In certain aspects, the memory 124 may be part of the SoC 100.

Figure 2:
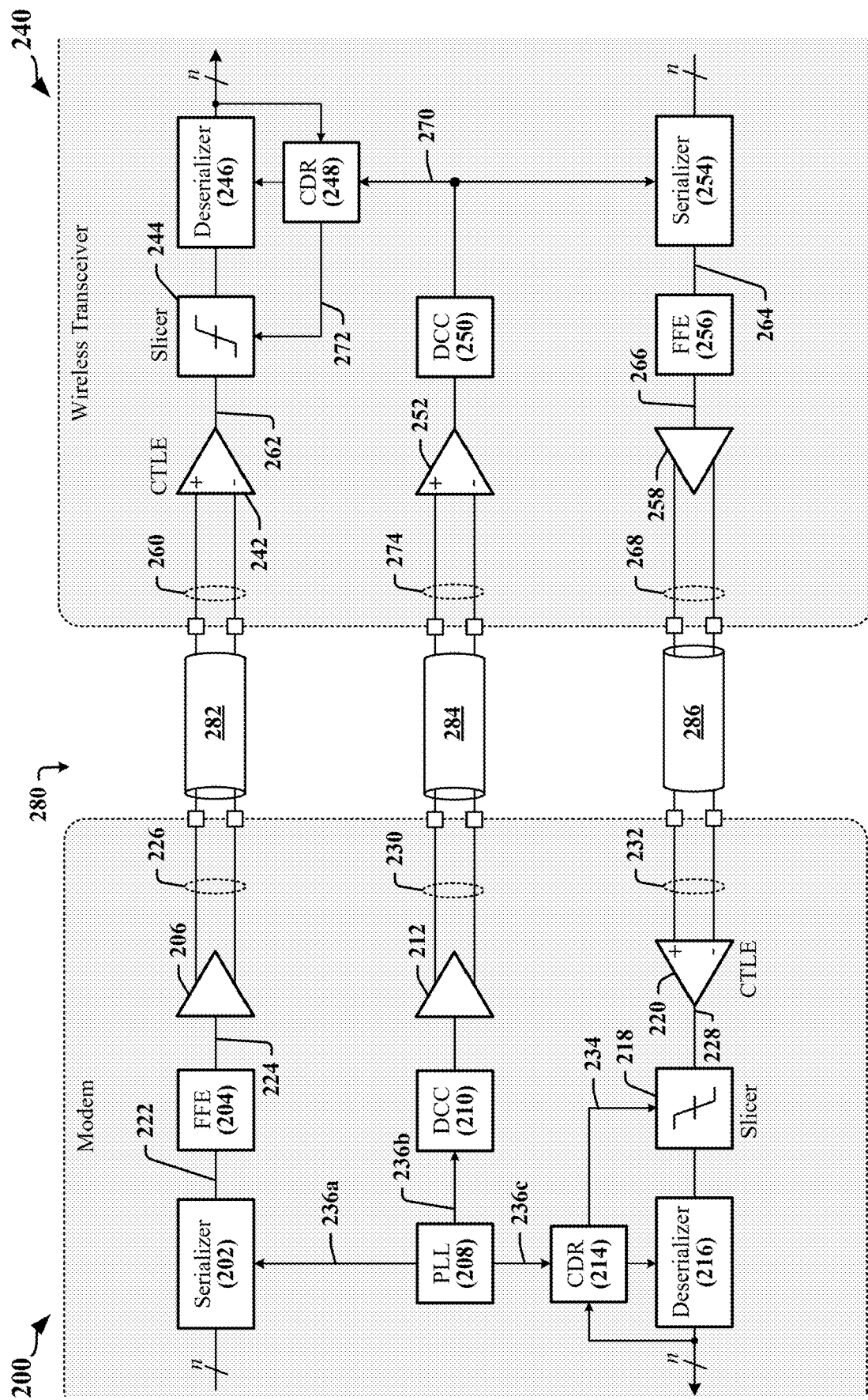
FIG. 2 illustrates a first example of a system that employs a multi-channel data communication link.

FIG. 2 illustrates a first example of a system that employs a multi-channel data communication link 280 to couple a modem 200 with a wireless transceiver 240. The data communication link 280 includes data channels 282 and 286 and a clock channel 284 that provide a transmission medium through which signals propagate between devices. In the illustrated example, a modem 200 transmits data in a first signal over a first data channel 282 to a wireless transceiver 240 and receives data in a second signal transmitted over a second data channel 286. Data signals are transmitted over the data channels 282 and 286 in accordance with timing information provided by a bus clock signal 230 transmitted over the clock channel 284.

In the illustrated example, data is encoded in differential signals that are transmitted by the modem 200 to the wireless transceiver 240 over a first data channel 282 and data is transmitted by the wireless transceiver 240 to the modem 200 over a second data channel 286. In some instances, data may be encoded in single ended signals. In some instances, bidirectional data channels are implemented whereby data can be transmitted and received through common input/output (I/O) pad.

The modem 200 may include a serializer 202 configured to convert n-bit parallel data elements, bytes or words into a serial data stream for transmission in a transmit data signal 222 over the first data channel 282. The transmit data signal 222 may be preconditioned by a pre-equalizing circuit, such as the illustrated digital feed-forward equalizer (the FFE 204), in order to combat or compensate for signal distortions attributable to inter-symbol interference (ISI), reflection and other effects that can be expected to limit bandwidth in first data channel 282. The preconditioned transmit data signal 224 output by the FFE 204 is provided to a driver circuit 206 that is configured drive the first data channel 282.

The modem 200 may include a serializer 202 configured to convert n-bit parallel data elements, bytes or words into a serial data stream for transmission in a serialized data signal 222. The serialized data signal 222 may be preconditioned by a pre-equalizing circuit, such as the illustrated digital feed-forward equalizer (the FFE 204), in order to combat or compensate for signal distortions attributable to inter-symbol interference (ISI), reflection and other effects that can be expected to limit bandwidth in the first data channel 282. A preconditioned data signal 224 output by the FFE 204 is provided to a driver circuit 206 that is configured generate and transmit a differential transmit data signal 226 over the first data channel 282.

The wireless transceiver 240 can be configured to process a data signal 260 received over the first data channel 282. The data signal 260 may be provided to a differential receiver 242, which may include or cooperate with an equalizing circuit. In one example, continuous time linear equalization (CTLE) may be used to compensate for certain losses experienced in the first data channel 282. The first data channel 282 may be characterized in some respects as a low-pass filter. In the illustrated example, the differential receiver 242 outputs an equalized data signal 262 that is sampled by a slicer 244. The slicer 244 may be implemented using a D-flipflop or the like and may be configured to capture signaling state of the equalized data signal 262 under the control of edges in a sampling clock signal 272 generated by a clock and data recovery (CDR) circuit 248. The output of the slicer 244 may be provided to a deserializer 246 that is clocked in accordance with one or more clock signals provided by the CDR circuit 248. The CDR circuit 248 may be configured to delay or phase shift a receiver clock signal 270 to ensure that edges in the sampling clock signal 272 are timed to optimize sampling reliability.

In the illustrated wireless transceiver 240, the receiver clock signal 270 is derived from a received bus clock signal 274 from the clock channel 284. A differential receiver 252 coupled to the clock channel 284 may be configured to equalize the received bus clock signal 274, and a duty cycle correction circuit 250 may be used to adjust the duty cycle of the receiver clock signal 270. The receiver clock signal 270 is provided to a serializer 254 that is configured to convert n-bit parallel data elements, bytes or words into a serial data stream for transmission in a serialized data signal 264. The serialized data signal 264 may be preconditioned by a pre-equalizing circuit, such as the illustrated FFE 256, in order to combat or compensate for signal distortions attributable to ISI, reflection and other effects that can be expected to limit bandwidth in the second data channel 286. A preconditioned data signal 266 output by the FFE 256 is provided to a driver circuit 258 that is configured generate and transmit a differential transmit data signal 268 over the second data channel 286.

The illustrated modem 200 can be configured to process a data signal 232 received over the second data channel 286. The data signal 232 may be provided to a differential receiver 220, which may include or cooperate with an equalizing circuit. In one example, CTLE may be used to compensate for certain losses experienced in the second data channel 286. The second data channel 286 may be characterized in some respects as a low-pass filter. In the illustrated example, the differential receiver 220 outputs an equalized data signal 228 that is sampled by a slicer 218. The slicer 218 may be implemented using a D-flipflop or the like and may be configured to capture signaling state of the equalized data signal 228 under the control of edges in a sampling clock signal 234 generated by a CDR circuit 214. The output of the slicer 218 may be provided to a deserializer 216 that is clocked in accordance with one or more clock signals provided by the CDR circuit 214. The CDR circuit 214 may be configured to delay or phase shift a transmitter clock signal to ensure that edges in the sampling clock signal 234 are timed to optimize sampling reliability.

A clock generation circuit, including the illustrated phase locked loop 208, may generate multiple clock signals 236a, 236b, 236c used by the modem 200. One or more of the clock signals 236a, 236b, 236c may be a divided version of a base clock signal generated by the PLL 208. One or more of the clock signals 236a, 236b, 236c may be phase shifted with respect to the base clock signal. In one example, the serializer 202 may produce the serialized data signal 222 using timing provided by a first clock signal 236a. In another example, the bus clock signal 230 transmitted over the clock channel 284 may be derived from a second clock signal 236b. In some instances, a duty cycle correction circuit 210 may be used to adjust the duty cycle of the second clock signal 236b and to provide an input to a driver circuit 212 that is configured drive the clock channel 284. In another example, the CDR circuit 248 may generate the sampling clock signal 234 from a third clock signal 236c.

Figure 3:
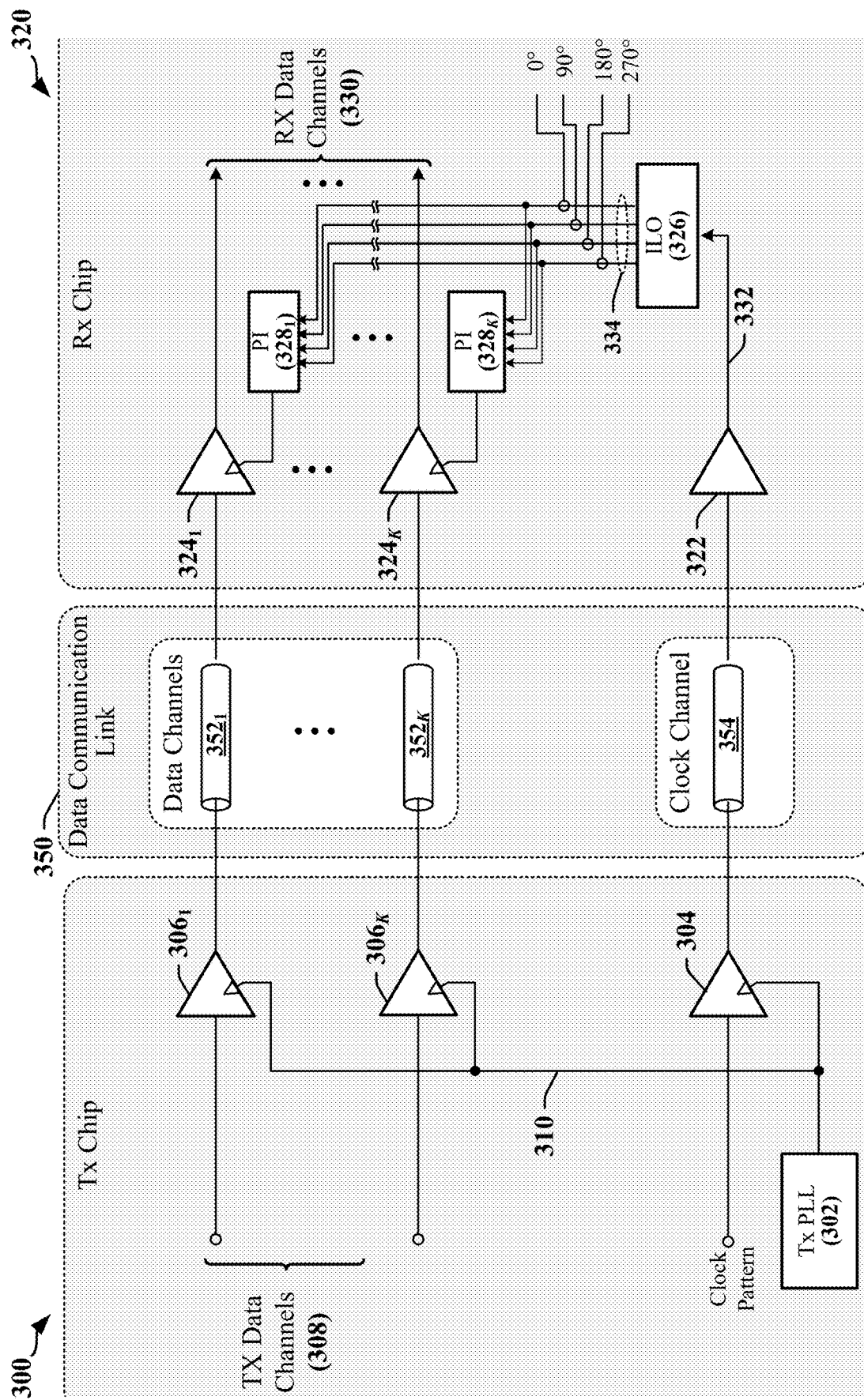
FIG. 3 illustrates a second example of a system that employs a multi-channel data communication link.

FIG. 3 illustrates a second example of a system that employs a multi-channel data communication link 350 to couple a transmitting device 300 with a receiving device 320. The data communication link 350 includes data channels $352_1$-$352_K$ that provide a transmission medium through which signals propagate from a first device to a second device. In the illustrated example, the transmitting device 300 can be configured to transmit data signals over one or more data channels $352_1$-$352_K$ in accordance with timing information provided by a clock signal transmitted over a clock channel 354. The transmitting device 300 may include serializers (not shown) configured to convert parallel data into serial data for transmission over the data channels $352_1$-$352_K$. The transmitting device 300 further includes data drivers $306_1$-$306_K$ configured to generate data signals over the one or more data channels $352_1$-$352_K$ to the receiving device 320 through the data communication link 350.

The illustrated example shows a configuration in which data is transmitted from a transmitting device 300 to a receiving device 320. In many implementations, the transmitting device 300 can also receive data and the receiving device 320 can also transmit data. In some of these implementations, the illustrated data channels $352_1$-$352_K$ may be bidirectional, and the same I/O pads can be used to transmit and receive data.

In some examples, the transmitting device 300 includes a clock driver 304 that generates the clock signal forwarded over the clock channel 354. In other examples, the clock channel 354 is omitted and the receiving device 320 is equipped with clock recovery circuits that can recover timing information from signals transmitted over one or more of the data channels $352_1$-$352_K$ in order to generate receive clock signals. Clock forwarding is common in communication systems, and provides the benefit that a phase locked loop (PLL) and other clock recovery circuits are not required in the receiving device 320. Typically, only one phase of the transmitter-generated clock signal is forwarded when clock forwarding is used. Limiting the number of clock signals can conserve power and the space that would be occupied by additional clock channels.

The receiving device 320 may be configured to receive and process the data signals. The receiving device 320 may generate additional phases of the received or recovered clock signal to obtain in-phase and quadrature (I/Q) versions of the clock signal to be used by phase interpolators $328_1$-$328_K$. A quadrature signal has phase that is shifted by 90° with respect to an in-phase signal. The phase interpolators $328_1$-$328_K$ may provide outputs that are phase-adjusted or phase-corrected I/Q versions of the clock signal. In one example, the outputs of each of the phase interpolators $328_1$-$328_K$ are provided to sampling circuits $324_1$-$324_K$.

Clock generation circuits in the receiving device 320 may include oscillators, which are fundamental building blocks of modern electronics. Oscillators are often implemented as ring oscillators (ROs), which can offer advantages over other types of oscillator including reduced area footprint, power efficiency and scalability with technological process. In the illustrated example, the clock generation circuits in the receiving device 320 includes an injection-locked oscillator (ILO 326) that receives a clock signal 332 from a line receiver 322 coupled to the clock channel 354 and generates phase-shifted versions 334 of the clock signal 332, including I/Q versions of the clock signal 332.

In high-speed applications, data throughput of a serial data link may be limited by the characteristics of the channel used to carry data signals. Impedance mismatches, parasitic coupling and other factors can cause signal distortion. In many implementations, equalization circuits and capabilities are included in input/output (I/O) circuits to compensate for signal distortions attributable to inter-symbol interference (ISI), reflection and other effects that can combine to limit bandwidth in a channel. ISI can result when a first-received symbol interferes with subsequently received symbols due to reflections, frequency-dependent delays and other imperfections in the channel. A symbol may refer to signaling state within a unit interval (UI), or symbol interval, in which data is modulated or encoded in the waveform of a transmitted signal.

Figure 4:
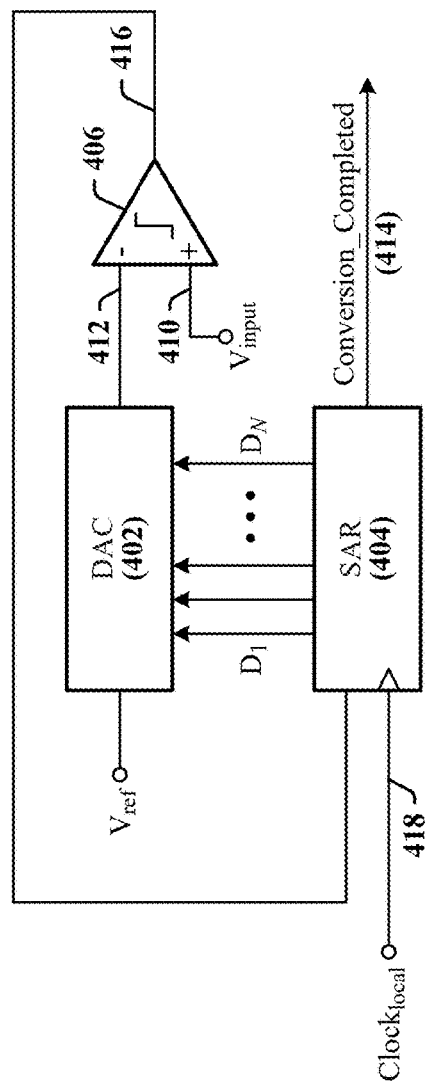
FIG. 4 illustrates an example of a successive approximation analog-to-digital converter.

Clock signals may be internally generated by certain circuits, including in memory interface and other SERDES-based interfaces. In one example, an analog-to-digital converter circuit (ADC) in a memory interface may generate an internal clock circuit that controls the conversion loop executed by the ADC for each sample of an analog signal. FIG. 4 illustrates an example of a successive approximation ADC 400, which may also be referred to as a SAR ADC based on the inclusion of a successive approximation register (the SAR 404). In the illustrated example, the SAR 404 provides a series of digital codes to a digital-to-analog convertor (the DAC 402). The digital codes approximate the voltage level of an input signal 410 with iteratively increasing precision. A comparator 406 compares the output 412 of the DAC 402 with the input signal 410 and provides a result signal 416 that indicates whether the voltage level of the output 412 of the DAC 402 exceeds the voltage of the input signal 410. The result signal 416 is fed back to the SAR 404 and used to determine the next digital code to be provided to the DAC 402.

The successive approximation ADC 400 effectively performs a binary search using a series of comparisons. In the illustrated example, the SAR 404 provides an N-bit digital code and may be expected to perform N comparison iterations. The SAR 404 is reset before each sampling period. The first digital code output by the SAR 404 has its most significant bit (MSB) set to binary '1' and the result signal 416 determines whether the MSB is to be maintained as binary '1' or to be switched to binary '0' for the remainder of the sampling period. When the result signal 416 indicates that the voltage level of the output 412 of the DAC 402 exceeds the voltage of the input signal 410, the MSB is switched to binary '0'. In the next comparison iteration, the bit position with the second highest weight in the second digital code is set to binary '1' and the result signal 416 determines whether this bit position remains at binary '1' or is switched to binary '0' for the remainder of the sampling period. The comparison iterations continue until a maximum of N comparison iterations have been performed or until the sampling period has terminated. The SAR 404 may assert an output signal (the Conversion_Completed signal 414) indicating that the maximum number (N) comparison iterations have been performed. The final digital code output by the SAR 404 is captured and provided as a digital representation of the input signal 410. The number of comparison iterations performed within the sampling period determine the precision of the digital representation of the input signal 410, where precision may be a measure of digitization error.

The duration of the sampling period may be determined by a sampling clock signal (not shown) generated by an interface circuit that employs the successive approximation ADC 400. The timing of the comparison iterations may be controlled by a clock signal (the Clock$_{local}$ signal 418). The Clock$_{local}$ signal 418 may be generated internally by certain types of successive approximation ADC.

Figure 5:
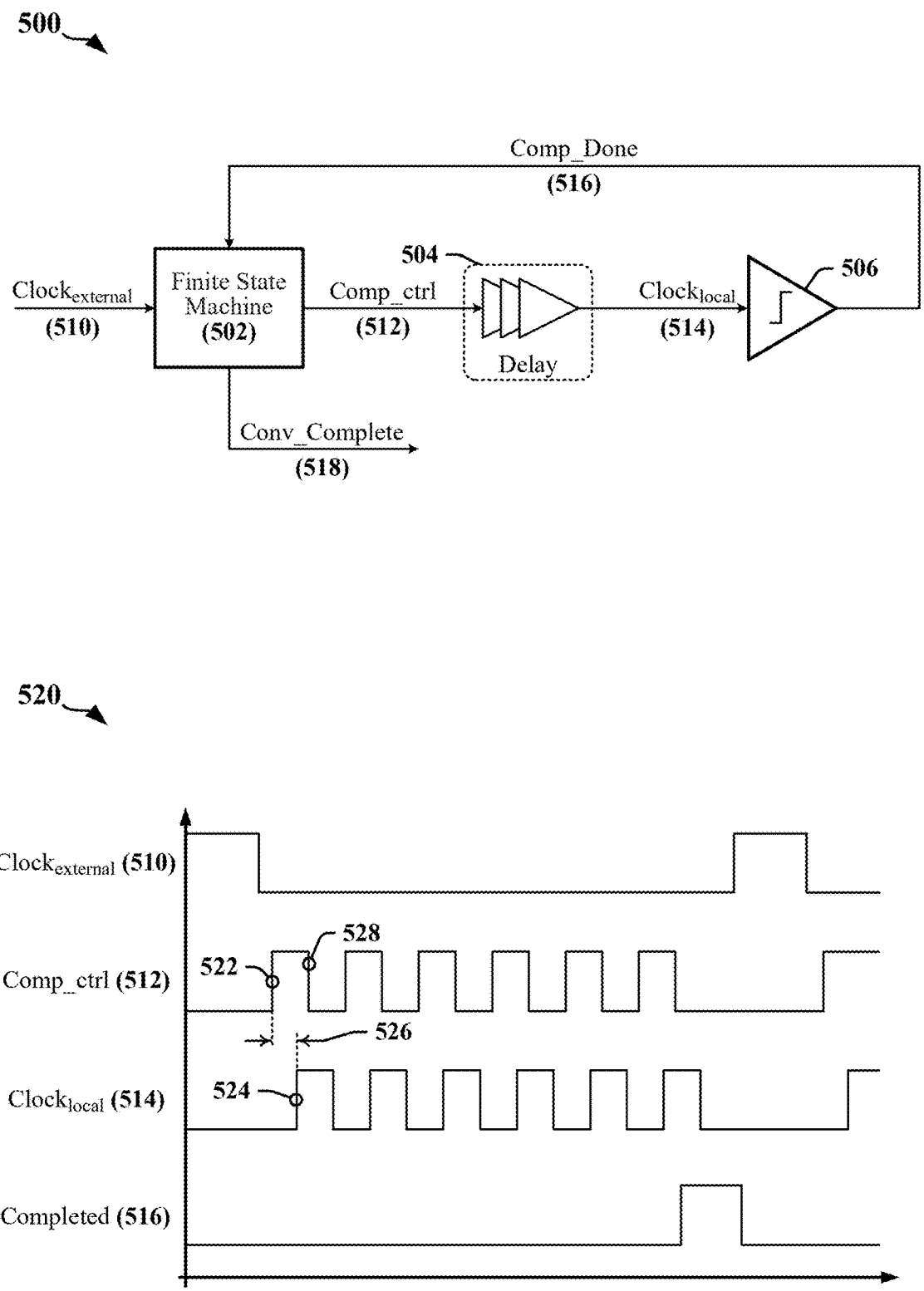
FIG. 5 illustrates certain aspects of a clock generation circuit in a successive approximation analog-to-digital converter.

FIG. 5 illustrates certain aspects of a clock generation circuit 500 in a successive approximation ADC. The clock generation circuit 500 generates an internal clock signal (the Clock$_{local}$ signal 514). The clock generation circuit 500 operates under the control of a finite state machine (the FSM 502) or another type of processor, controller or sequencing logic. With reference also to the timing diagram 520, the FSM 502 provides a signal (the Comp_ctrl signal 512) to a delay circuit 504 that provides the Clock$_{local}$ signal 514. When the Clock$_{local}$ signal 514 transitions to a first signaling state, comparison logic 506 performs a comparison of the voltage level of an analog input signal (see the input signal 410 of FIG. 4 as an example) with a voltage level defined by a SAR (e.g., the SAR 404) that may be included in or associated with the comparison logic 506.

The comparison logic 506 generates a signal indicating state of comparison. In the illustrated example, the comparison logic 506 asserts a Comp_Done signal 516 that is provided to the FSM 502 to indicate that the current comparison has been completed.

In the illustrated example, the FSM 502 causes the Comp_ctrl signal 512 to transition to a high signaling state at a first point in time 522. The Clock$_{local}$ signal 514 follows the Comp_ctrl signal 512 and transitions to the high signaling state at a second point in time 524 that occurs after a delay 526 that is at least partially attributable to the delay circuit 504. The comparison logic 506 initiates a comparison in response to the Clock$_{local}$ signal 514 transitioning to the high signaling state. The comparison logic 506 asserts the Comp_Done signal 516 after capturing the result of the comparison. The FSM 502 responds to the assertion of the Comp_Done signal 516 by causing the Comp_ctrl signal 512 to transition to a low signaling state at a third point in time 528. The SAR in the comparison logic 506 may generate a new digital code for the next comparison iteration when the Clock$_{local}$ signal 514 follows the Comp_ctrl signal 512 and transitions to the low signaling state.

The FSM 502 may be configured to assert a conversion complete signal (the Conv_Complete signal 518) upon completion of a predefined number of comparison iterations. In some instances, the predefined number of comparison iterations may correspond to the number of bits defined for the ADC or SAR. In other instances, the predefined number of comparison iterations may be less than the number of bits defined for the ADC or SAR. In the illustrated example, a maximum of six comparison iterations are performed in each sampling period. The FSM 502 may be further configured to assert the Conv_Complete signal 518 when the sampling period has expired, as determined by an external sampling clock signal 510. In some instances, the sampling period may expire before the maximum number of comparison iterations are performed.

The illustrated clock generation circuit 500 provides an asynchronous loop that can support faster operation of an ADC without the need for an external clock that has a higher frequency than the sampling clock signal 510. In some implementations, the clock generation circuit 500 is enabled and disabled by the sampling clock signal 510. The Clock$_{local}$ signal 514 can be used to reset the comparison logic 506. The Clock$_{local}$ signal 514 can be used to update state information maintained by the FSM 502. The clock generation circuit 500 includes a feedback loop and operates in the manner of a ring oscillator. The period ($T_{clk\_local}$) of the Clock$_{local}$ signal 514 may be calculated or defined as the sum of the delays in the loop, such that:

$$T_{clk\_local} = 2*(T_{D_{FSM}} + T_{D_{DLY}} + T_{D_{CQ}}),$$

where $T_{D_{FSM}}$ is the delay introduced by the FSM 502, $T_{D_{DLY}}$ is the delay introduced by the delay circuit 504 and $T_{D_{CQ}}$ is the delay introduced by the comparison logic 506. The period of the Clock$_{local}$ signal 514 is double the combination of delays, which can be expected to affect rising edges and falling edges to the same degree. It can be expected that the largest contribution to the period of the Clock$_{local}$ signal 514 is provided by the delay introduced by the delay circuit 504. In many instances, the delay circuit 504 can be configured to ensure that minimum, setup, hold and propagation timing defined for sample and hold circuits and other circuits that are not included in the clock generation loop are met.

Figure 6:
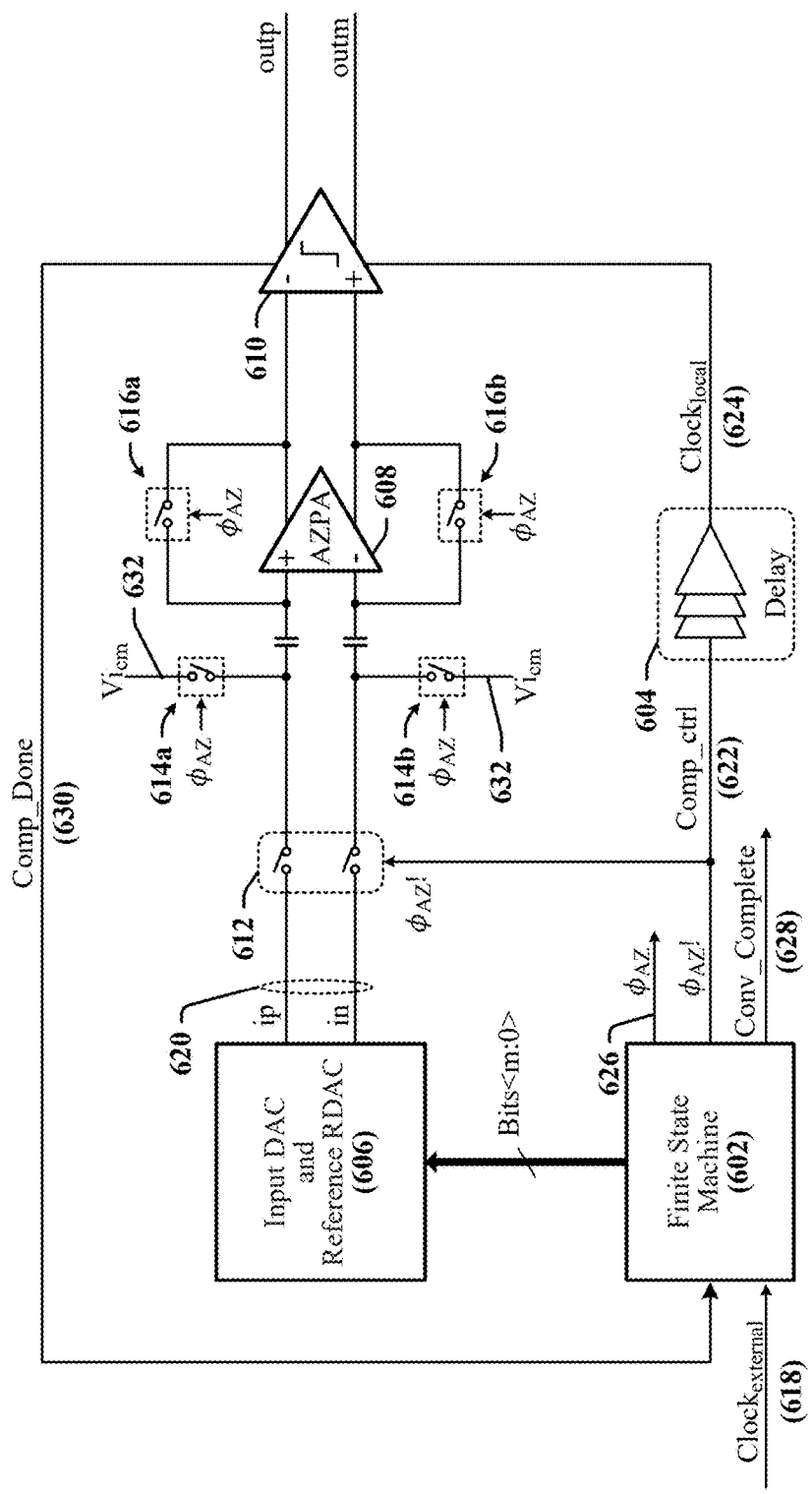
FIG. 6 illustrates certain aspects of an asynchronous successive approximation analog-to-digital converter.

FIG. 6 illustrates certain aspects of an asynchronous successive approximation ADC 600 that includes auto-zeroing circuits and other ancillary circuits that may be subject to minimum timing requirements that are not directly accommodated by an internal clock generation loop. The internal clock generation loop corresponds in many respects to the internal loop implemented by the clock generation circuit 500 illustrated in FIG. 5.

The clock generation circuit generates an internal clock signal (the Clock$_{local}$ signal 624). The asynchronous successive approximation ADC 600 operates under the control of FSM 602 or another type of processor, controller or sequencing logic. The FSM 602 provides a signal (the Comp_ctrl signal 622) to a delay circuit 604 that provides the Clock$_{local}$ signal 624. The Clock$_{local}$ signal 624 can be set and/or reset the comparison logic 610 and can be used to update state information maintained by the FSM 602. When the Clock$_{local}$ signal 624 transitions to a first signaling state, comparison logic 610 performs a comparison of the voltage level of an analog input signal (see the input signal 410 of FIG. 4 as an example) with a voltage level defined by a SAR (e.g., the SAR 404) included in the comparison logic 610.

The comparison logic 610 generates a signal indicating state of comparison. In the illustrated example, the comparison logic 610 asserts a Comp_Done signal 630 that is provided to the FSM 602 to indicate that the current comparison has been completed. The Clock$_{local}$ signal 624 follows the Comp_ctrl signal 622. Transitions in the Clock$_{local}$ signal 624 are delayed with respect to corresponding transitions in the Comp_ctrl signal 622 by a duration defined, at least in part, by the delay circuit 604. In one example, the comparison logic 610 initiates a comparison in response to the Clock$_{local}$ signal 624 transitioning to the high signaling state. The comparison logic 610 asserts the Comp_Done signal 630 after capturing the result of the comparison. The FSM 602 responds to the assertion of the Comp_Done signal 630 by causing the Comp_ctrl signal 622 to transition to a low signaling state. The SAR in the comparison logic 610 may generate a new digital code for the next comparison iteration when the Clock$_{local}$ signal 624 transitions to the low signaling state.

The FSM 602 may be configured to assert a conversion complete signal (the Conv_Complete signal 628) when a predefined number of comparison iterations has been completed. The predefined number of comparison iterations may correspond to the number of bits defined for the ADC or SAR. The FSM 602 may be further configured to assert the Conv_Complete signal 628 when the sampling period determined by an external sampling clock signal has expired, including when less than the maximum number of comparison iterations have been performed within the sampling period. The asynchronous successive approximation ADC 600 may be enabled and disabled by an external clock signal 618.

The asynchronous successive approximation ADC 600 includes a static auto-zeroing pre-amplifier (the AZPA 608) that may be configured to reduce common mode and other offsets at the input to the comparison logic 610. The comparison logic 610 may include a clocked comparator that is enabled by a high signaling state in the Clock$_{local}$ signal 624. The AZPA 608 operates in an amplification mode and is coupled to a DAC circuit 606 when a high signaling state is present on the Comp_ctrl signal 622 and the outputs of the AZPA 608 drive the inputs of the clocked comparator in the comparison logic 610. In the illustrated example, the AZPA 608 is coupled to an output 620 of the DAC circuit 606 through a first pair of switches 612 that may be enabled (i.e., closed) by the high signaling state in the Comp_ctrl signal 622. When the Comp_ctrl signal 622 is in a low signaling state, the first pair of switches 612 may be disabled (i.e., opened) and the AZPA 608 is uncoupled from the DAC circuit 606. Switches 614a, 614b, 616a and 616b are enabled when a non-overlapping complementary version 626 of the Comp_ctrl signal 622 is in a high signaling state, replacing the output 620 of the DAC circuit 606 with a signal 632 representing common mode input voltage, and configuring the AZPA 608 for a static auto-zeroing mode to reduce offsets.

The asynchronous successive approximation ADC 600 includes a feedback loop and operates in the manner of a ring oscillator. In many implementations, the delay provided by the delay circuit 604 dominates the combined delay through the feedback loop. The delay circuit 604 may be configured to provide sufficient timing to allow for proper settling of the AZPA 608 in auto-zeroing mode and/or in amplification mode. In one example, the delay circuit 604 is configured to provide a nominal 1 nanosecond (1 nS) delay, which substantially exceeds the delays incurred through the FSM 602 and comparison logic 610. Accordingly, the period ($T_{clk\_local}$) of the Clock$_{local}$ signal 624 may be represented as:

$$T_{clk\_local} = 2*(T_{DFSM} + T_{DDLY} + T_{DC2Q}) \approx 2*T_{DDLY}.$$

The delay provided by the delay circuit 604 may be subject to large variations, which result in the period of the Clock$_{local}$ signal 624 exhibiting large timing variations. In some instances, the delay circuit 604 may be unable to attain nominal design delay values under all expected manufacturing process, circuit supply voltage, and die temperature (PVT) variations and conditions. PVT corners may refer to operating points, parameters and/or conditions that are defined by manufacturing tolerances (process corners) and by different voltage or temperature limits defined for circuits included in the asynchronous successive approximation ADC 600. Variations in the period of the Clock$_{local}$ signal 624 may result in poor performance of the asynchronous successive approximation ADC 600 and/or may require complex and inefficient circuit design to minimize the variation.

Figure 7:
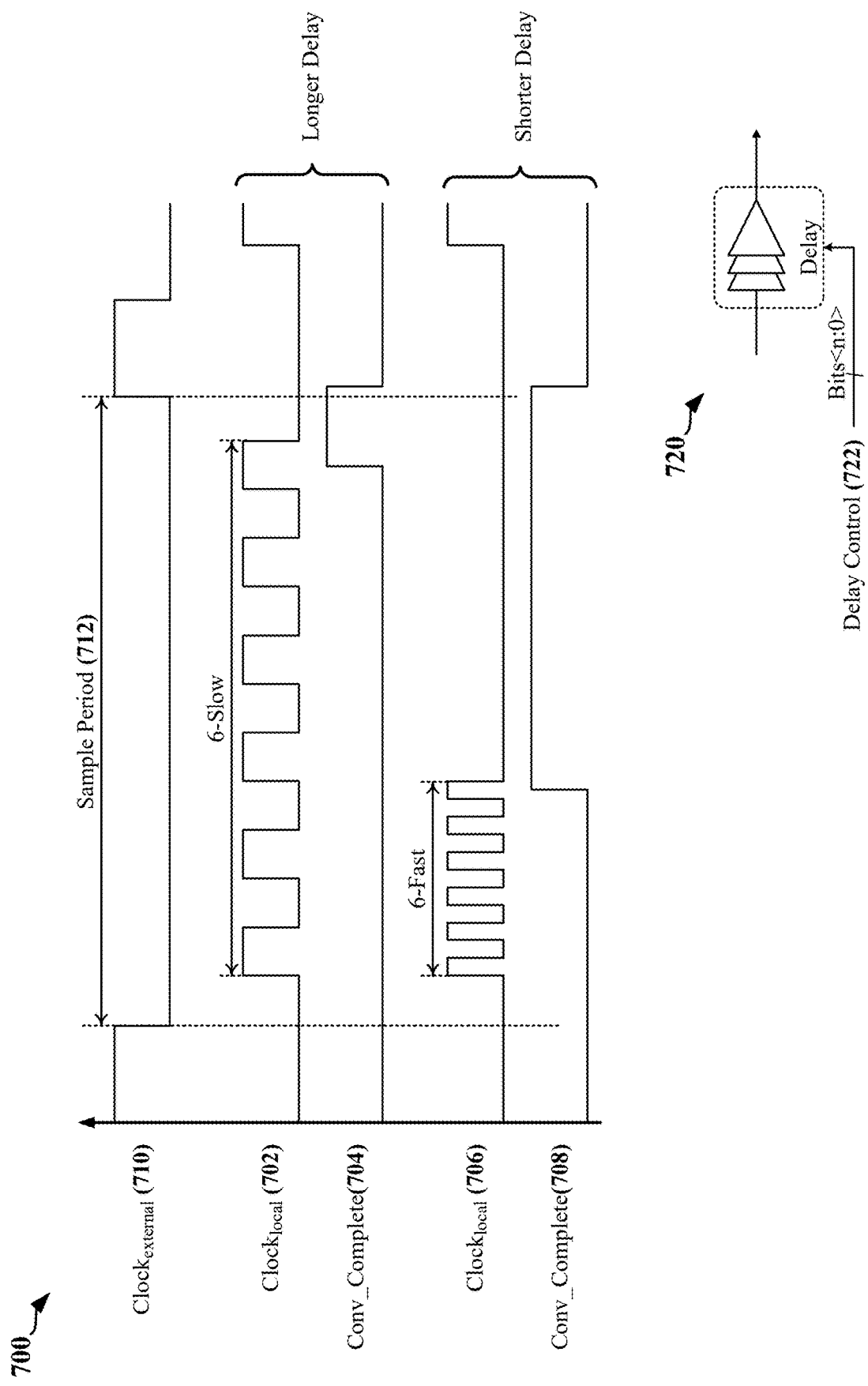
FIG. 7 illustrates an example of the effects of manufacturing process, circuit supply voltage, and die temperature variations on the performance of the asynchronous successive approximation analog-to-digital converter illustrated in FIG. 6.

FIG. 7 is a timing diagram 700 that illustrates an example of the effects of PVT variations on the performance of the asynchronous successive approximation ADC 600 illustrated in FIG. 6. The FSM 602 may be configured to assert a conversion complete signal. In the timing diagram 700, the Clock$_{local}$ signal 702 and Conv_Complete signal 704 relate to an operational context in which the delay provided by the delay circuit 604 exceeds a nominal or designed delay for the delay circuit 604. The Clock$_{local}$ signal 706 and Conv_Complete signal 708 relate to an operational context in which the delay provided by the delay circuit 604 is less than the nominal or designed delay for the delay circuit 604. In the illustrated example, the FSM 602 asserts the conversion complete signal in both operational contexts before the sample period 712 has expired. However, very large variations can occur, which may be deemed unacceptable due to the impact on the analog to digital conversion process. In the illustrated example, there is variation of nearly 300% between the frequency of the Clock$_{local}$ signals 702 and 706.

Variations in delay may be attributable to a number of factors, including PVT variances. When the delay duration is reduced sufficiently, the level of variation can impact the reliability or resolution of the analog to digital conversion process and conversion results may include errors due to offsets caused by improper settling of the AZPA 608. Certain aspects of the asynchronous successive approximation ADC 600 may be designed to overcome expected delay variances. In one example, smaller resistance values may be used in circuits such as the DACs in order to shorten required settling time. Smaller resistance values are associated with increased power consumption and thermal generation. In another example, the bias current in the AZPA 608 may be increased, which again can increase power consumption. In another example, a faster comparator may be implemented with associated increased power consumption and greater susceptibility to noise.

In some conventional implementations, a delay circuit 720 may be calibrated using external control of delay generation in order to optimize performance across PVT corners. In the illustrated example, an external calibration circuit may provide a multibit delay control signal 722 to select a desired delay duration. In conventional systems, operation of the ADC must be halted in order to calibrate the delay circuit 720 after real time changes in input clock frequency, voltage and temperature occur. Moreover, a relatively complex calibration circuit is needed. The calibration circuit requires measurement subcircuits that can accurately measure the delay provided by the delay circuit 720. The measurement subcircuits typically require controllers, analog circuit blocks and memory to maintain a lookup table to index delay values with codewords to be provided over the control signal 722. The calibration circuit is required to be insensitive to PVT variations, noise and signal mismatches. Typically, the calibration circuit consumes considerable numbers of transistors and semiconductor real estate, and requires additional input/output (I/O) pins with associated increases in circuit layout complexity. The delay resolution available to the calibration circuit is typically affected by PVT variances.

Certain aspects of this disclosure relate to self-calibrating delay generating circuits in asynchronous loops. In one aspect, errors due to noise and improper settling in circuits associated with an asynchronous loop can be reduced. The asynchronous loop may operate as a ring oscillator. In one aspect the self-calibrating delay generating circuits may use digital counter feedback to monitor and adjust delays in an asynchronous loop. In certain implementations, the delay introduced in the oscillator loop may be effectively measured without significantly disrupting operation of the underlying circuits. The measured delays may be used to calibrate one or more delay circuits. In certain examples described herein, the ring oscillator loop is provided in a successive approximation ADC. However, techniques, methods, circuits and systems are described may be used in other applications.

According to certain aspects of this disclosure, a ring oscillator that is implemented using a delay loop can be calibrated using a counter or shift register. The counter or shift register may be used to track or record a number of cycles in a clock signal generated by the ring oscillator. The number of cycles of the clock signal that are observed to occur within an externally defined period of time may be compared with an expected number of clock cycles for the externally defined period of time. In one example, the externally defined period of time corresponds to a sampling interval defined by a clock signal generated by an ADC. One or more delays in the delay loop may be adjusted or reconfigured to modify the frequency of the clock signal generated by the ring oscillator in order to produce the expected number of clock cycles that occur within the externally defined period of time.

In one aspect of the disclosure, delay produced within the delay loop can be adjusted in a linear manner. For example, a delay element may be configured or adjusted in steps, where each step increases or decreases the delay provided by the delay element by a fixed duration of time, which may be referred to as a unit delay time. In this example, the relationship between the difference between expected clock cycles and observed clock cycles has a linear relationship with the number of step adjustments to the delay element needed to minimize or eliminate the difference.

The calibration procedure can occur within one unit of the externally defined period of time. In the example of an ADC, the calibration procedure can occur within one sampling interval. The calibration procedure can be implemented using digital logic. The presently-disclosed calibration procedure is expected to be highly scalable and PVT invariant. The presently-disclosed calibration procedure can be used to adjust the frequency of the clock signal generated by the ring oscillator in order to accommodate changes within the externally defined period of time.

According to certain aspects of the disclosure, the calibration procedure can be performed in the background without impacting the operation of circuits, interfaces and systems the embody the ring oscillator. In one example, a replica of an operational delay loop may be used to calibrate delay elements in an operational primary delay loop and in the replica of the operational delay loop.

According to certain aspects of the disclosure, the calibration procedure can be adapted to accommodate changes in circuits that employ the clock signal generated by the ring oscillator. The number of cycles observed in a clock signal generated by the ring oscillator can be used to determine operating characteristics of a comparators that responds to the clock signal. In one example, the number of observed clock cycles may be used to control or accommodate transistor switching speeds and thereby reduce noise associated with comparators operating at process corners where switching speeds are increased.

Certain aspects of the disclosure are applicable to a broad variety of delay generation circuits, including circuits that control delay by managing the magnitude of current that charges or discharges a capacitor, circuits that control delay by adjusting the length of an inverter, and so on.

Figure 8:
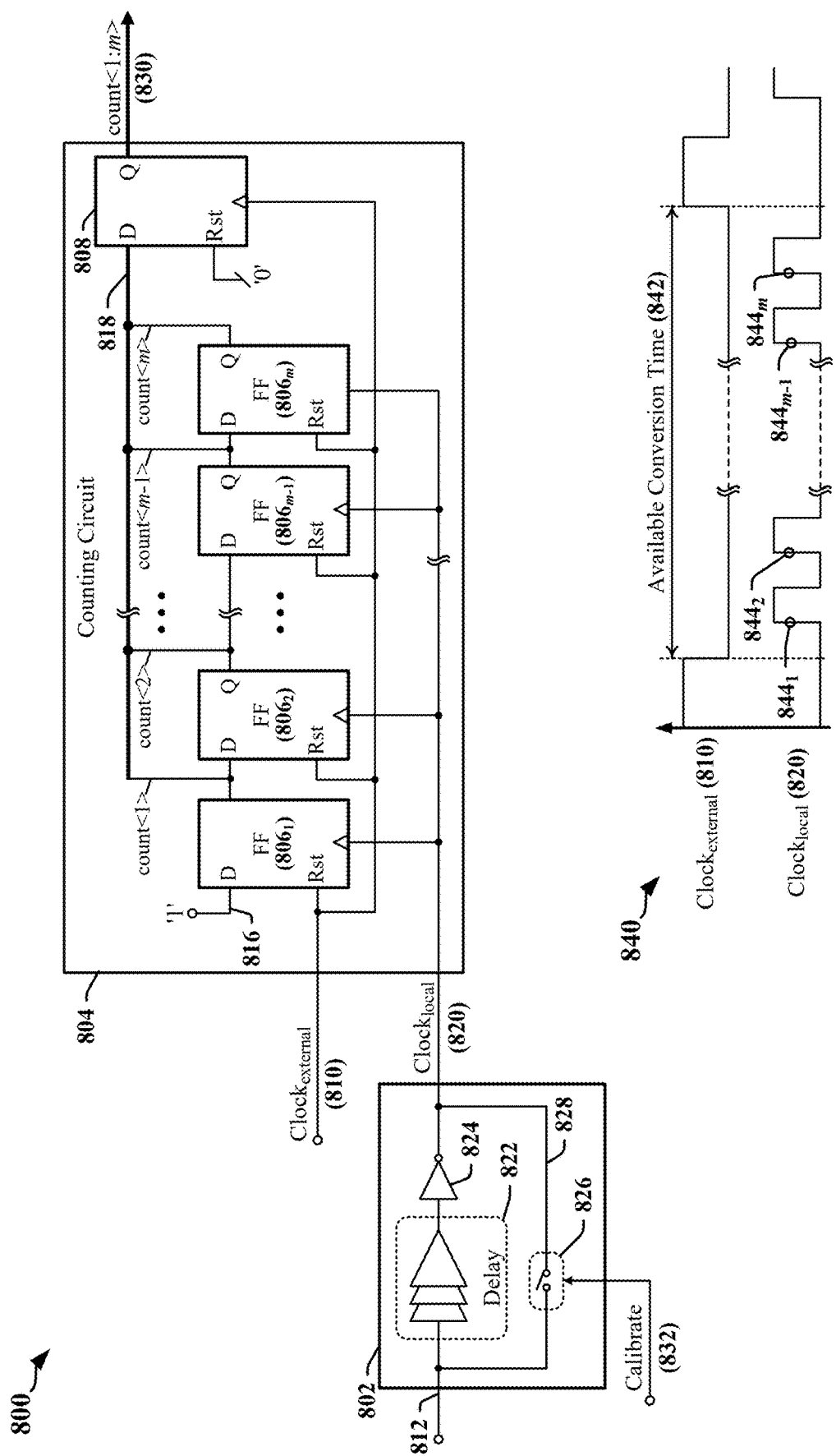
FIG. 8 illustrates one example of a self-calibrating delay loop provided in accordance with certain aspects of this disclosure.

FIG. 8 illustrates one example of a self-calibrating delay loop 800 that may be configured in accordance with certain aspects of this disclosure. The self-calibrating delay loop 800 includes an asynchronous loop 802 and a counter 804 that is configured to count clock cycles in a clock signal (the Clock$_{local}$ signal 820) generated by the asynchronous loop 802.

The asynchronous loop 802 may correspond in some respects to the clock generation circuit 500 illustrated in FIG. 5. The illustrated asynchronous loop 802 includes a calibration feedback path 828 that is operable during calibration. For the purposes of calibration, a calibrate signal 832 asserted by a FSM, controller or other processor causes a switch 826 to be enabled, thereby closing the calibration feedback path 828. In some implementations, the calibrate signal 832 may uncouple a control signal 812 from the FSM, controller or other processor. In one example, the control signal 812 corresponds to the Comp_ctrl signal 512 illustrated in FIG. 5.

In the illustrated example, the asynchronous loop 802 includes a configurable delay circuit 822 that drives the Clock$_{local}$ signal 820 through an inverter 824. In this example, the delay circuit 822 includes non-inverting delay elements. The inverter 824 is provided in the illustrated example to ensure that the calibration feedback path 828 provides negative feedback, thereby ensuring that the asynchronous loop 802 operates as a free-running ring oscillator during calibration. The delay circuit 822 may alternatively include an odd number of inverting delay elements for every configurable delay configurable for the delay circuit 822.

In the illustrated example, the counter 804 includes a number (m) of flipflops 806$_1$-806$_m$, each of which is clocked by the Clock$_{local}$ signal 820. In one example, each of the flipflops 806$_1$-806$_m$ propagates its input (D) through to its output (Q) on each rising edge in the Clock$_{local}$ signal 820. The input 816 of the first in-line flipflop 806$_1$ is coupled to a voltage source representing logic '1' and the input of each of the other flipflops 806$_2$-806$_m$ is coupled to the output of the immediately preceding flipflop 806$_1$-806$_{m-1}$. In the illustrated example, the flipflops 806$_1$-806$_m$ are reset when an external clock signal (the Clock$_{external}$ signal 810) is set to the high signaling state. In one example, the Clock$_{external}$ signal 810 corresponds to the external sampling clock signal 510 illustrated in FIG. 5. In other examples, the counter 804 may be configured as a digital counter that outputs a multibit binary-encoded number representative of the number of rising edges detected in the Clock$_{local}$ signal 820 when the counter 804 is enabled by the Clock$_{external}$ signal 810. The Clock$_{external}$ signal 810 is provided to the clock input of a latch or register 808 that has a multibit input 818 that is configured to receive the outputs of the flipflops 806$_1$-806$_m$. In some instances, the latch or register 808 is implemented using flipflops.

When the Clock$_{external}$ signal 810 transitions to the low signaling state, the logic '1' input of the first in-line flipflop 806$_1$ is propagated through successive flipflops 806$_1$-806$_m$ on each rising edge 844$_1$-844$_m$ in the Clock$_{local}$ signal 820. When the Clock$_{external}$ signal 810 transitions to the high signaling state, the latch or register 808 captures the outputs of the flipflops 806$_1$-806$_m$, and the flipflops 806$_1$-806$_m$ are subsequently reset. The output of the latch or register 808 provides a multibit count signal 830 that represents the number of clock cycles detected while the Clock$_{external}$ signal 810 is in the low signaling state.

With reference to the timing diagram 840 in FIG. 8, the Clock$_{external}$ signal 810 is in the low signaling state for an available conversion time period 842 that corresponds to the time available for a successive approximation ADC in each sampling period, for example. In the illustrated example, m cycles of the Clock$_{local}$ signal 820 occur within the available conversion time period 842.

The multibit count signal 830 provides an indication of the total number of comparison iterations that may be performed within the available conversion time period 842 for a current configuration of the self-calibrating delay loop 800. A comparison iteration may also be referred to as a comparison cycle. The available conversion time period 842 and the measured number of comparison iterations can be used to calibrate and/or define the delay provided by the configurable delay circuit 822.

In one example, the configurable delay circuit 822 is initially configured to provide a desired or nominal delay under nominal operating conditions. When the asynchronous loop 802 is affected by PVT or other variations, the number of comparison iterations measured during a comparison cycle will differ from the expected number of counted cycles. The configurable delay circuit 822 may be calibrated to produce the expected counted number of cycles of the Clock$_{local}$ signal 820 during each subsequent comparison cycle. For example, the configurable delay circuit 822 may be calibrated to perform the minimum number of comparison iterations needed to obtain analog to digital conversion with a desired precision or resolution in each sampling period, which may correspond to the available conversion time period 842.

In the illustrated example, the period (T$_{clk\_local}$) of the Clock$_{local}$ signal 820 generated during calibration may be represented as:

$$T_{clk\_local}=2*T_{DDLY}.$$

As disclosed in relation to the asynchronous successive approximation ADC 600 illustrated in FIG. 6, the delay provided by the delay circuit 822 typically dominates other delays present in an internal clock generation loop and it can be expected that the delay configured for the delay circuit 822 as a result of calibration will enable the internal clock generation loop to perform nominally in normal operation.

According to certain aspects of this disclosure, the multibit count signal 830 provided by the latch or register 808 responds to the operating point, operating parameters and/or conditions under which the self-calibrating delay loop 800 is operating. For example, self-calibrating delay loop 800 may produce a Clock$_{local}$ signal 820 with a non-nominal frequency due to PVT variances when the delay circuit 822 is initially configured for nominal operating conditions. In one example, the frequency of the Clock$_{local}$ signal 820 may be increased as a result of PVT variation, causing the multibit count signal 830 to indicate a higher count value than expected. In another example, the frequency of the Clock$_{local}$ signal 820 may be decreased due to PVT variation, causing the multibit count signal 830 to indicate a lower count value than expected. In these examples the value of the multibit count signal 830 may be used to tune the delay element in the asynchronous loop 802 to obtain a desired number of conversions in the available conversion time period 842.

According to certain aspects of this disclosure, the value of the multibit count signal 830 may be used to tune or calibrate the self-calibrating delay loop 800 by changing the duration of the delay produced by the delay circuit 822. In one aspect, the delay circuit 822 may be implemented to enable a control node to change the delay monotonically. In certain implementations, the delay produced by the delay circuit 822 changes linearly when adjusted by the control node. The control node may be implemented using a FSM, controller, processor and/or combinational logic.

Figure 9:
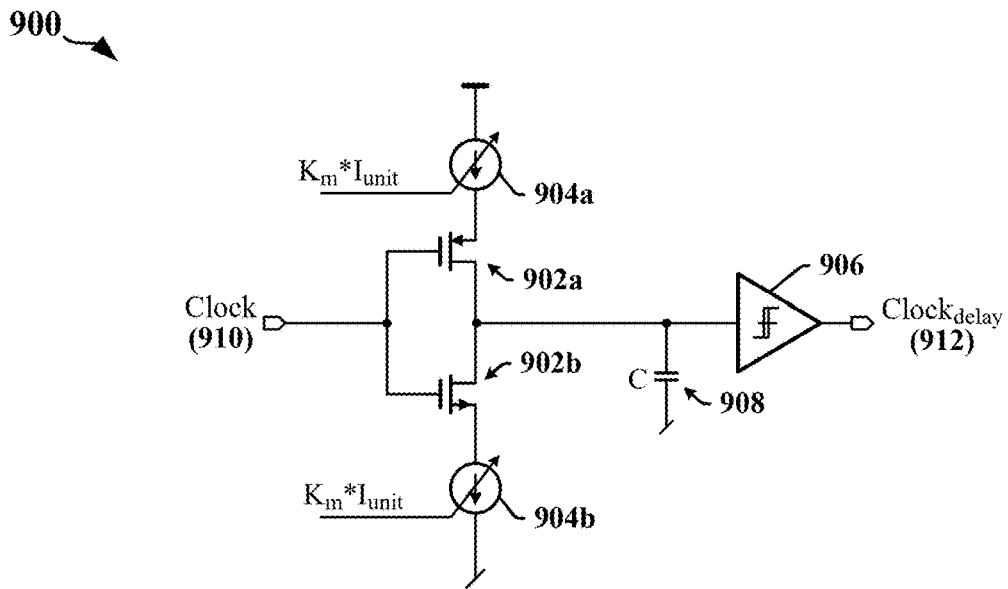
FIG. 9 illustrates examples of delay subcircuits that may be used to implement an adjustable delay circuit according to certain aspects of this disclosure.
Figure 9:
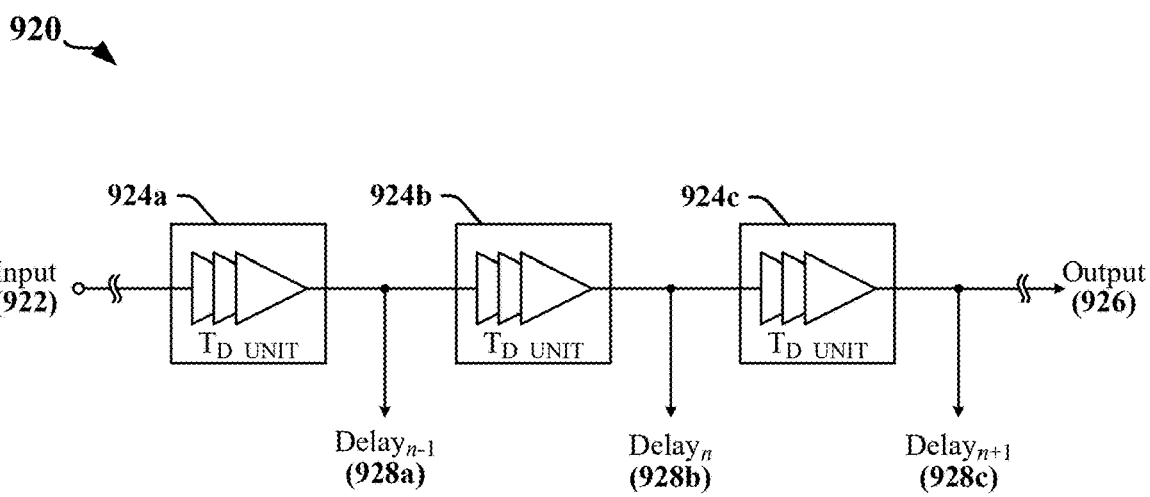

FIG. 9 illustrates examples of delay subcircuits 900, 920 that may be used to implement an adjustable delay circuit such as the delay circuit 822 illustrated in FIG. 8. A first delay subcircuit 900 implements a current/capacitance (I/C) delay element that includes a capacitor 908. The capacitor 908 is charged at a rate determined by a first current source 904a and discharged at a rate determined by a second current source 904b. The rate of charging and discharging are preferably or nominally equal. In one example, the second current source 904b may be configured to sink a current that has the same magnitude as the current sourced by the first current source 904a. The first current source 904a is coupled to the capacitor 908 through a first transistor 902a and the second current source 904b is coupled to the capacitor 908 through a second transistor 902b. The drains of the first transistor 902a and the second transistor 902b are coupled to the capacitor and to a comparator 906 that provides a delayed output (the Clock$_{delay}$ signal 912) of the first delay subcircuit 900. The comparator 906 exhibits hysteresis in that the threshold voltage used to trigger a switch during positive transitions is different from the threshold voltage used to trigger a switch during negative transitions.

The gates of the first transistor 902a and the second transistor 902b are coupled to an input clock signal 910. The first transistor 902a is turned off when the clock signal 910 is in a high voltage state and turned on when the clock signal 910 is in a low voltage state. The second transistor 902*b* is turned on when the clock signal 910 is in the high voltage state and turned off when the clock signal 910 is in the low voltage state. The capacitor 908 is charged when the first transistor 902*a* is turned on and discharged when the second transistor 902*b* is turned on. In the I/C delay element, the delay ($T_{delay}$) provided by a delay circuit may be expressed as:

$$T_{delay} \propto K_m \times \frac{I_{unit}}{C} \times V_{th},$$

where $K_m$ represents the number of units of current, $I_{unit}$ represents the magnitude of each unit of current, C represents the capacitance associated with the capacitor 908, and $V_{th}$ represents the switching threshold of the comparator 906. The delay provided by the delay circuit may be linearly adjusted by increasing the number of units of current used to charge and discharge the capacitor 908. In some implementations, $K_m$ represents the number of enabled current source elements that are coupled in parallel to provide each of the first current source 904*a* and the second current source 904*b*. Each current source element may be a current source that is configured to sink or source a unit of current.

A second delay subcircuit 920 implements an inverter delay chain. Multiple unit delay elements, including unit delay elements 924*a*, 924*b*, 924*c* each introduce a unit delay. The duration of the unit delay may be defined by the number of transistor stages in a unit delay element 924*a*, 924*b*, 924*c* and/or by capacitances within the unit delay elements 924*a*, 924*b*, 924*c*. Each of the unit delay elements 924*a*, 924*b*, 924*c* has an identical or near-identical structure and the unit delay elements 924*a*, 924*b*, 924*c* are typically located in close proximity on a semiconductor die. Accordingly, each unit delay element 924*a*, 924*b*, 924*c* can be expected to provide a the same delay under varying PVT conditions. In some implementations, each unit delay element 924*a*, 924*b*, 924*c* may be implemented using a circuit that corresponds in some respects to the first delay subcircuit 900, but with a fixed current source.

A control node can change the delay through the delay circuit by configuring the length of the inverter delay chain. The length of the inverter delay chain may be defined as the number of active unit delay elements 924*a*, 924*b*, 924*c* used to couple an input 922 to an output 926 of the second delay subcircuit 920. In one example, the control node may activate switches to bypass some number of unit delay elements 924*a*, 924*b*, 924*c*. In another example, multiplexing logic (not shown) may be used to select between different delayed versions 928*a*, 928*b*, 928*c* of a signal received at the input 922 of the second delay subcircuit 920.

The delay ($T_{delay}$) provided by a delay circuit that includes unit delay elements 924*a*, 924*b*, 924*c* may be calculated as:

$$T_{delay} \propto K_D \times T_{unit},$$

where $K_D$ represents the number of unit delay elements 924*a*, 924*b*, 924*c* in the inverter delay chain, and $T_{unit}$ represents the nominal duration of the delay introduced by each of the unit delay elements 924*a*, 924*b*, 924*c*.

With continued reference to FIGS. 8 and 9, a self-calibrating delay generating circuit provided in accordance with certain aspects of this disclosure can use the multibit count signal 830 provided by the latch or register 808 to adjust the frequency of the Clock$_{local}$ signal 820. In some implementations, the multibit count signal 830 is provided to a linear tuning node that implements a hardwired equivalent of a lookup table using combinational logic. In these implementations, the use of the delay subcircuits 900 or 920 in the delay circuit permits monotonic and/or linear adjustment of the delay produced by the delay circuit 822.

The relationship between the value of the multibit count signal 830 and the number of unit delay elements to be used in a delay circuit may be defined by simple mathematical ratios. In a nominally operating delay circuit, the product of the nominal number ($K_{nom}$) of active or included delay subcircuits 900, 920 and the duration of the delay ($T_{unit}$) introduced by each delay subcircuit 900, 920 can be used to calculate the nominal or expected number (M) of comparison cycles within the conversion time period 842. The relationship may be stated as:

$$K_{nom} \times T_{unit} \rightarrow M.$$

In a delay circuit that is operating at a fast corner, the number ($K_{nom}$) of active or included delay subcircuits 900, 920 initially remains the same but the duration of the delay ($T_{unit\_FF}$) introduced by each delay subcircuit 900, 920 decreases. The relationship in this case may be stated as:

$$K_{nom} \times T_{unit\_FF} \rightarrow N,$$

where N represents the number of observed cycles within the conversion time period 842. In this case, N>M. The nominal or expected number (M) of comparison cycles can be obtained in this case using a scaling factor that can be calculated as follows:

$$(K_{nom} \times T_{unit\_FF}) \times \frac{M}{N} \rightarrow N \times \frac{M}{N} = M.$$

In a delay circuit that is operating at a slow corner, the number ($K_{nom}$) of active or included delay subcircuits 900, 920 initially remains the same but the duration of the delay ($T_{unit\_SS}$) introduced by each delay subcircuit 900, 920 increases. The relationship in this case may be stated as:

$$K_{nom} \times T_{unit\_SS} \rightarrow L,$$

where L represents the number of observed cycles within the conversion time period 842. In this case, M>L. The nominal or expected number (M) of comparison cycles can be obtained in this case using a scaling factor that can be calculated as follows:

$$(K_{nom} \times T_{unit\_FF}) \times \frac{M}{L} \rightarrow L \times \frac{M}{L} = M.$$

In the general case, the calibrated number ($K_{cal}$) of active or included delay subcircuits 900, 920 may be calculated as follows:

$$K_{cal} = K_{Current} \times \frac{M}{O}.$$

where M represents the number of comparison cycles expected under nominal or ideal operating conditions, when the delay circuit is configured to use a preconfigured or nominal number ($K_{current}$) of active or included delay subcircuits 900, 920, and where O represents the number of observed cycles within the conversion time period 842. The currently configured number of active or included delay subcircuits 900, 920 can be modified using the M/O scaling factor, for every value of $K_{current}$. The scaling factor can be hardwired into a delay circuit that is configured in accordance with certain aspects of this disclosure. In one example, a delay circuit includes combinational logic that is responsive to digital observations expressed as the multibit count signal 830 can implement the scaling factor for every combination values of O and $K_{current}$. The scaling factor may be implemented as an effective look-up table (LUT) embedded in the combinational logic of the delay circuit and may be operationally unaffected by PVT variances. That is to say that the combinational logic of the delay circuit responds to current observed cycle counts regardless of operating point or associated PVT corner. In the example illustrated in FIG. 8, the output of each flipflop $806_1$-$806_m$ is used to enable at least one unit delay element. The number of unit delay elements that contribute to the delay produced by a delay circuit may be calculated as the sum of a minimum number of unit delay elements and the number of flipflops $806_1$-$806_m$ that have an output set to logic '1'.

FIG. 10 illustrates an example of a lookup table 1000 that may be embedded in a delay circuit configured in accordance with certain aspects of this disclosure. In this example, the current number of active or included delay elements ($K_{current}$) is 13 and the number (M) of clock cycles expected within the conversion time period 842 is also 13. In some implementations, the number of number of active or included delay elements is larger than required to provide margin for PVT variation or to accommodate setup and hold timing, etc. The table shows the scaling factor calculated for each possible value for the number (O) of observed cycles as a fraction and as a real number ("Raw $K_{cal}$"). The table further shows the number of unit delays ($K_{cal}$) to be selected for each number of observed cycles. In one example, the combinational logic of the delay circuit may define a combination of delay elements to be enabled or included in the delay circuit for each number of observed cycles.

Figure 11:
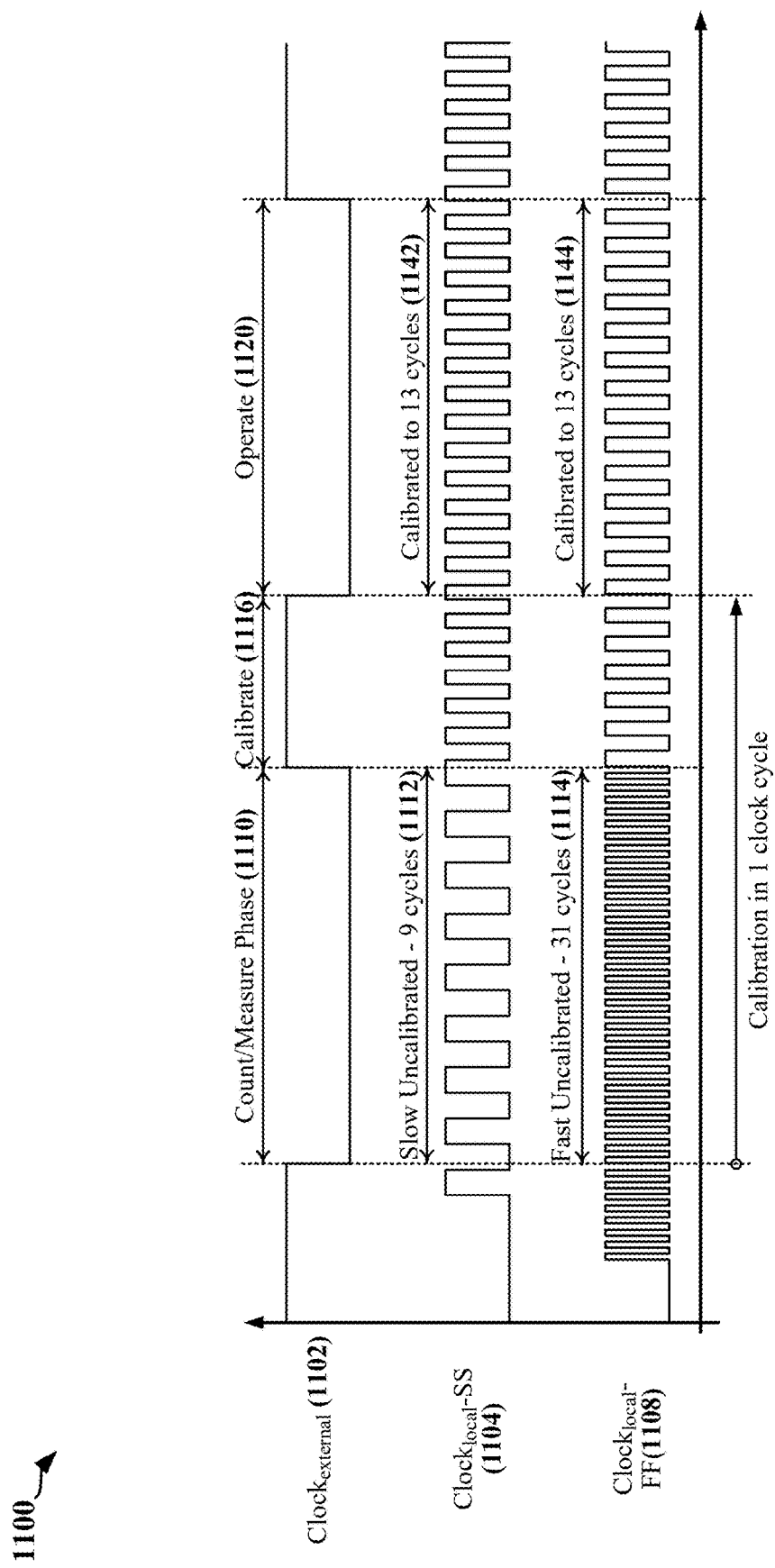
FIG. 11 illustrates the operation of a self-calibrating delay loop provided in accordance with certain aspects of this disclosure.

FIG. 11 is a timing diagram 1100 that illustrates the operation of the self-calibrating delay loop 800 for two different operating points. In both examples, the internal clock signal is calibrated within one cycle of the external clock signal (the $Clock_{external}$ signal 1102). In the first example, an internal clock signal (the $Clock_{local}$-SS signal 1104) initially has a lower frequency than expected or desired. The multibit count signal 830 output by the latch or register 808 indicates that nine cycles 1112 were counted during a count and/or measure phase 1110 of the calibration. During a calibrate phase 1116 of the calibration, the frequency of the $Clock_{local}$-SS signal 1104 increases as the number of active or included delay elements in the delay circuit 822 is decreased. The multibit count signal 830 indicates that thirteen cycles 1142 were counted during the normal operating phase 1120 commencing with the next cycle of the $Clock_{external}$ signal 1102.

In the second example, an internal clock signal (the $Clock_{local}$-FF signal 1108) initially has a higher frequency than expected or desired. The multibit count signal 830 output by the latch or register 808 indicates that 31 cycles 1114 were counted during a count and/or measure phase 1110 of the calibration. During a calibrate phase 1116 of the calibration, the frequency of the $Clock_{local}$-FF signal 1108 decreases as the number of active or included delay elements in the delay circuit 822 is increased. The multibit count signal 830 indicates that thirteen cycles 1144 were counted during the normal operating phase 1120 commencing with the next cycle of the $Clock_{external}$ signal 1102.

Figure 12:
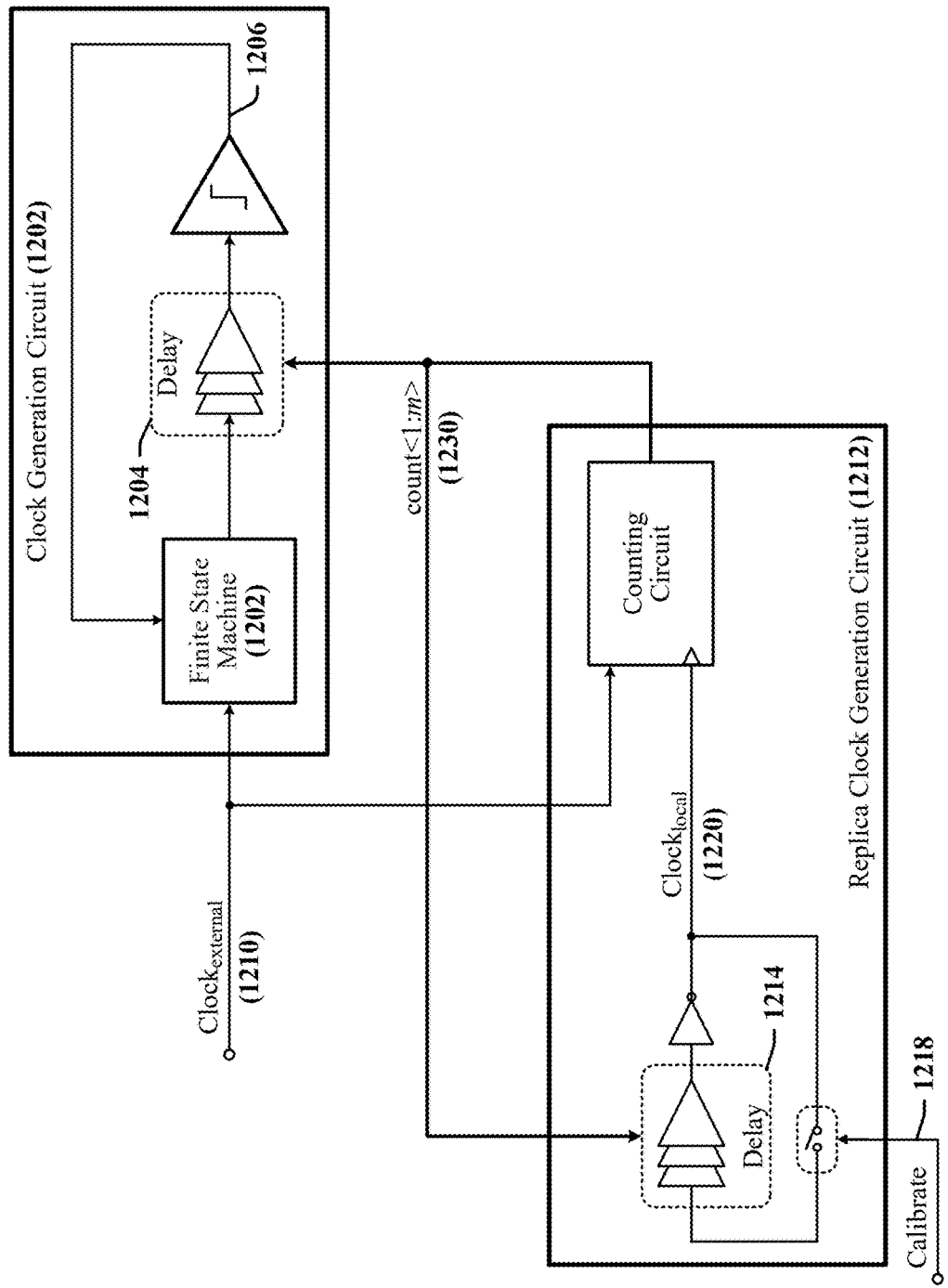
FIG. 12 illustrates an example of a dynamic calibration circuit provided in accordance with certain aspects of this disclosure.

FIG. 12 illustrates an example of a calibration circuit 1200 that can perform dynamic calibration provided in accordance with certain aspects of this disclosure. Dynamic calibration may be performed when the calibration circuit 1200 can adjust the frequency of an internal clock signal 1206 in a clock generation circuit 1202 without disrupting normal operation of the clock generation circuit 1202. In one example, the clock generation circuit 1202 is provided in a successive approximation ADC and the dynamic calibration of the clock generation circuit 1202 can be performed without affecting the operation of the successive approximation ADC.

Dynamic calibration may be accomplished using a replica clock generation circuit 1212. The replica clock generation circuit 1212 may correspond to the self-calibrating delay loop 800 illustrated in FIG. 8. The clock generation circuit 1202 and the replica clock generation circuit 1212 receive the same sampling clock signal (the $Clock_{external}$ signal 1210. The clock generation circuit 1202 and the replica clock generation circuit 1212 both include identical or near-identical delay circuits 1204 and 1214. The delay circuits 1204 and 1214 are controlled by the same multibit count signal 1230 (cf. the multibit count signal 830 in FIG. 8) such that the same number of unit delays are activated or included in the delay circuits 1204 and 1214. A feedback loop in the replica clock generation circuit 1212 may be closed by asserting a calibration signal 1218. The replica clock generation circuit 1212 can adjust the number of unit delays activated or included in the delay circuits 1204 and 1214 based on cycles counted in an internal clock signal (the $Clock_{local}$ signal 1220) of the replica clock generation circuit 1212.

According to certain aspects of the disclosure, the calibration procedure can be adapted to accommodate changes in circuits that are provided in a delay loop used to generate a clock signal. The period ($T_{clk\_local}$) of a clock signal generated using a feedback loop may be calculated or defined as the sum of the delays in the loop, such that:

$$T_{clk\_local} = 2^{*}(T_{D_{FSM}} + T_{D_{DLY}} + T_{D_{C2Q}}),$$

with reference to the clock generation circuit 500 illustrated in FIG. 5, $T_{D_{FSM}}$ may represent the delay introduced by a FSM 502, $T_{D_{DLY}}$ may represent the delay introduced by the delay circuit 504, and $T_{D_{C2Q}}$ may represent the delay introduced by the comparison logic 506. In various implementations disclosed herein, the delay introduced by the delay circuit in a delay loop is dominant and other delays can be ignored. However, other sources of delay within the delay loop may contribute significantly to $T_{clk\_local}$ in some implementations.

In one example, the delay introduced by a comparator in a successive approximation ADC may contribute a variable delay to the total delay produced by the delay loop used to generate the clock signal. The noise generated by the comparator typically peaks at the fastest operating points (fast corners) of the successive approximation ADC. In one example, the comparator noise can increase to 150% above an average or nominal level for the comparator. In one example, the fastest operating points correspond to PVT corners at which transistor switching speeds are increased. In some implementations, the noise associated with the comparator can be decreased by slowing the transistors or circuits in the comparator when fast corners are detected. Fast corners may be detected by monitoring the configuration of the delay circuit in the delay loop. The number of unit delays needed to generate a clock signal with nominal or desired frequency indicates whether the delay elements are producing delays that are shorter or longer than the nominal or designed unit delay duration. In some instances, fast corners may be detected by monitoring the number of cycles measured in a ring oscillator clock signal generated by the calibration circuit when configured for nominal operation. In these instances, a fast corner is indicated when the number of measured cycles is greater than the number of expected cycles.

The speed of operation of a comparator may be calibrated, configured or adjusted based on measurements of clock cycles obtained by a self-calibrating delay generating circuit that is configured in accordance with certain aspects of this disclosure. In one example, the number of delay elements in a delay circuit or the number of cycles counted in a sampling interval may be used to configure one or more current sources on the comparator. In this example, the current sources may be coupled to the sources of one or more transistors and the level of current flowing to or from a current source may determine the switching speed of at least one transistor. Decreasing the speed of an ADC at fast corners can increase the effective number of bits produced by the ADC by limiting the effects of noise.

In some implementations, the self-calibrating delay generating circuit or an associated calibration circuit may define a set point for the speed of the comparator. In certain implementations, the set point may be used to configure current sources used by the comparator. According to certain aspects of this disclosure, the self-calibrating delay generating circuit may associate the set point for the speed of the comparator with an expected duration for $T_{D\_C2Q}$, which represents the delay introduced to the delay loop by the comparator. The relationship between the lock signal generated by the ring oscillator and the number of cycles counted by the self-calibrating delay generating circuit may be rendered non-linear, but remains monotonic, when the value of $T_{D\_C2Q}$ changes with the speed of the comparator. The hardwired lookup table embedded in the delay element may be non-linear, but is PVT invariant and can be used for self-calibration when the value of $T_{D\_C2Q}$ changes with the speed of the comparator.

Figure 13:
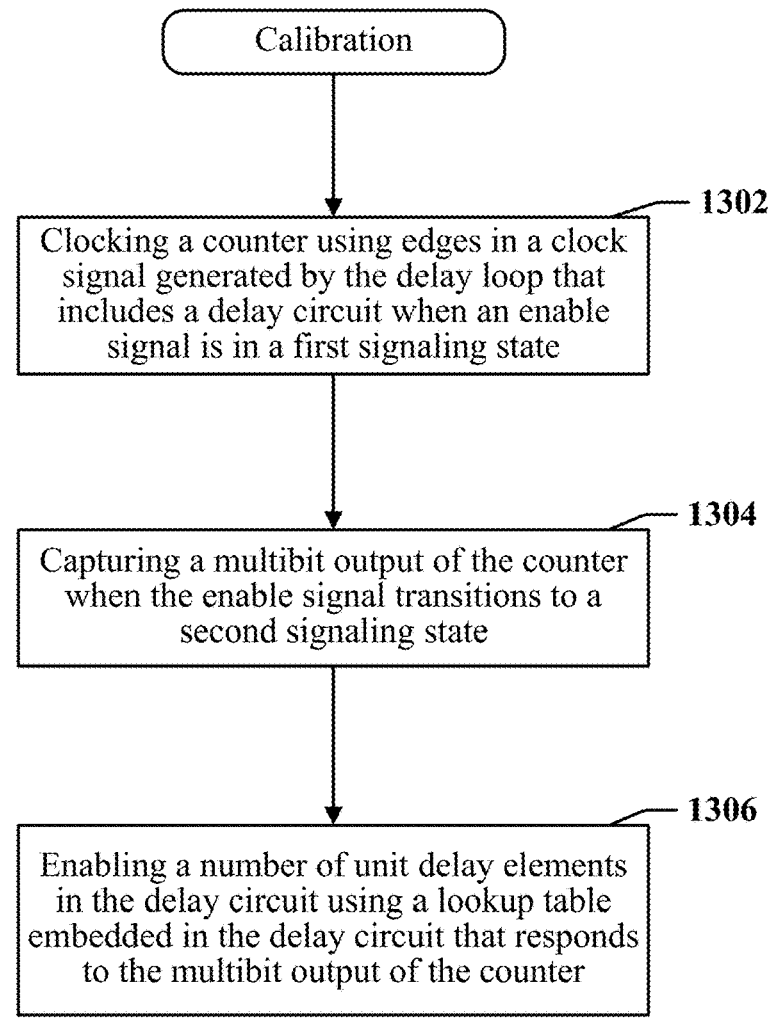
FIG. 13 is a flow diagram illustrating an example of a method for transmitting a data signal over a communication link in accordance with certain aspects disclosed herein.

FIG. 13 is a flow diagram illustrating an example of a calibration method 1300. The calibration method may be performed using the self-calibrating delay loop 800 illustrated in FIG. 8. At block 1302, a counter may be clocked using edges in a clock signal generated by a delay loop that includes a delay circuit when an enable signal is in a first signaling state. At block 1304, a multibit output of the counter may be captured when the enable signal transitions to a second signaling state. At block 1306, a number of unit delay elements in the delay circuit may be enabled based on the multibit output of the counter. In one example, the number of enabled unit delay elements is based on a difference between the multibit output of the counter and a multibit value expected to be generated when the delay circuit is operating nominally.

In certain implementations, an associated delay circuit in a clock generation loop of an analog-to-digital converter may be configured based on the multibit output of the counter. In one example, a lookup table embedded in the associated delay circuit is configured to enable a number of unit delay elements in the associated delay circuit based on the multibit output of the counter.

In certain implementations, combinational logic is configured to enable combinations of the unit delay elements based on bit values in the multibit output of the counter. The counter may be implemented using series-connected flipflops. Each flipflop of the series-connected flipflops may be configured to provide one bit of the multibit output of the counter. A binary value may be propagated through one of the series-connected flipflops in response to each edge in the clock signal. An output of each flipflop of the series-connected flipflops may be used to enable at least one of the unit delay elements when the binary value has been propagated to the output of the each flipflop.

In certain implementations, the multibit output of the counter is captured when the delay loop is operated in a first mode of operation. A comparator may be included in the delay loop when the delay loop is operated in a second mode of operation.

The operational steps described in any of the exemplary aspects herein are described to provide examples. The operations described may be performed in numerous different sequences other than the illustrated sequences. Furthermore, operations described in a single operational step may actually be performed in a number of different steps. Additionally, one or more operational steps discussed in the exemplary aspects may be combined. It is to be understood that the operational steps illustrated in the flow diagrams may be subject to numerous different modifications as will be readily apparent to one of skill in the art. Those of skill in the art will also understand that information and signals may be represented using any of a variety of different technologies and techniques. For example, data, instructions, commands, information, signals, bits, symbols, and chips that may be referenced throughout the above description may be represented by voltages, currents, electromagnetic waves, magnetic fields or particles, optical fields or particles, or any combination thereof.

The various operations of methods described above may be performed by any suitable means capable of performing the corresponding functions. The means may include various hardware and/or software component(s) and/or module (s), including, but not limited to a circuit, an application-specific integrated circuit (ASIC), or processor. Generally, where there are operations illustrated in figures, those operations may have corresponding counterpart means-plus-function components with similar numbering. In certain aspects, an apparatus includes means for counting cycles of a clock signal generated by a delay loop that includes a delay circuit. The means for counting cycles of a clock signal generated by the delay loop may include series-connected flipflops clocked by edges in the clock signal. Each flipflop of the series-connected flipflops may provide one bit of a multibit output. The apparatus may also include means for capturing the multibit output. A number of unit delay elements in the delay circuit may be enabled based on the multibit output.

In some implementations, a corresponding number of unit delay elements delay circuit in an associated clock generation loop provided in an analog-to-digital converter may be enabled based on the multibit output. The associated delay circuit may be provided in a clock generation loop of an analog-to-digital converter. Combinational logic may be configured to enable combinations of the unit delay elements based on bit values in the multibit output. The multibit output may be captured when the delay loop is operated in a first mode of operation. A comparator may be included in the delay loop when the delay loop is operated in a second mode of operation. An operating characteristic of the comparator is configured based on the multibit output of the counter.

In one implementation, a calibration circuit has a delay loop, a counter and a latch. The delay loop that includes a delay circuit. The counter is clocked by edges in a clock signal generated by the delay loop when an enable signal is in a first signaling state. The latch is configured to capture a multibit output of the counter when the enable signal transitions to a second signaling state. A number of unit delay elements in the delay circuit may be enabled based on the multibit output of the counter. In one example, the number of enabled unit delay elements is based on a difference between the multibit output of the counter and a multibit value expected to be generated when the delay circuit is operating nominally.

In certain examples, the multibit output of the counter is used to configure an associated delay circuit in a clock generation loop of an analog-to-digital converter. In some examples, the number of enabled unit delay elements is based on a difference between the multibit output of the counter and a multibit value expected to be generated when the delay circuit is operating nominally.

In various examples, combinational logic is configured to enable combinations of the unit delay elements based on bit values in the multibit output of the counter. The counter may include series-connected flipflops. Each flipflop of the series-connected flipflops may provide one bit of the multibit output of the counter. A binary value may be propagated through one of the series-connected flipflops in response to each edge in the clock signal. An output of each flipflop of the series-connected flipflops may enable at least one of the unit delay elements when the binary value has been propagated to the output of the each flipflop.

In certain examples, the multibit output of the counter is captured when the delay loop is operated in a first mode of operation. A comparator may be included in the delay loop when the delay loop is operated in a second mode of operation. An operating characteristic of the comparator may be configured based on the multibit output of the counter.

Some implementation examples are described in the following numbered clauses:

1. A calibration circuit comprising: a delay loop that includes a delay circuit; a counter that is clocked by edges in a clock signal generated by the delay loop when an enable signal is in a first signaling state; and a latch configured to capture a multibit output of the counter when the enable signal transitions to a second signaling state, wherein a number of unit delay elements in the delay circuit are enabled based on the multibit output of the counter.
2. The calibration circuit as described in clause 1, wherein the multibit output of the counter is used to configure an associated delay circuit in a clock generation loop of an analog-to-digital converter.
3. The calibration circuit as described in clause 1 or clause 2, wherein the number of enabled unit delay elements is based on a difference between the multibit output of the counter and a multibit value expected to be generated when the delay circuit is operating nominally.
4. The calibration circuit as described in any of clauses 1-3, further comprising: combinational logic that is configured to enable combinations of the unit delay elements based on bit values in the multibit output of the counter.
5. The calibration circuit as described in clause 4, wherein the counter comprises: series-connected flipflops, wherein each flipflop of the series-connected flipflops provides one bit of the multibit output of the counter, and wherein a binary value is propagated through one of the series-connected flipflops in response to each edge in the clock signal.
6. The calibration circuit as described in clause 5, wherein an output of each flipflop of the series-connected flipflops enables at least one of the unit delay elements when the binary value has been propagated to the output of the each flipflop.
7. The calibration circuit as described in any of clauses 1-6, wherein the multibit output of the counter is captured when the delay loop is operated in a first mode of operation and wherein a comparator is included in the delay loop when the delay loop is operated in a second mode of operation.
8. The calibration circuit as described in clause 7, wherein an operating characteristic of the comparator is configured based on the multibit output of the counter.
9. An apparatus comprising: means for counting cycles of a clock signal generated by a delay loop that includes a delay circuit, including series-connected flipflops clocked by edges in the clock signal, each flipflop of the series-connected flipflops providing one bit of a multibit output; and means for capturing the multibit output, wherein a number of unit delay elements in the delay circuit are enabled based on the multibit output.
10. The apparatus as described in clause 9, wherein a corresponding number of unit delay elements delay circuit in an associated clock generation loop provided in an analog-to-digital converter is enabled based on the multibit output.
11. The apparatus as described in clause 9 or clause 10, further comprising: combinational logic that is configured to enable combinations of the unit delay elements based on bit values in the multibit output.
12. The apparatus as described in any of clauses 9-11, wherein the multibit output is captured when the delay loop is operated in a first mode of operation and wherein a comparator is included in the delay loop when the delay loop is operated in a second mode of operation.
13. The apparatus as described in clause 12, wherein an operating characteristic of the comparator is configured based on the multibit output of the counter.
14. A calibration method comprising: clocking a counter using edges in a clock signal generated by a delay loop that includes a delay circuit when an enable signal is in a first signaling state; capturing a multibit output of the counter when the enable signal transitions to a second signaling state; and enabling a number of unit delay elements in the delay circuit using a lookup table that responds to the multibit output of the counter and that is embedded in the delay circuit.
15. The method as described in clause 14, comprising: configuring an associated delay circuit in a clock generation loop of an analog-to-digital converter based on the multibit output of the counter.
16. The method as described in clause 14 or clause 15, wherein the number of enabled unit delay elements is based on a difference between the multibit output of the counter and a multibit value expected to be generated when the delay circuit is operating nominally.
17. The method as described in any of clauses 14-16, further comprising: enabling combinations of the unit delay elements based on bit values in the multibit output of the counter.
18. The method as described in clause 17, wherein the counter comprises series-connected flipflops, wherein each flipflop of the series-connected flipflops provides one bit of the multibit output of the counter, and wherein a binary value is propagated through one of the series-connected flipflops in response to each edge in the clock signal.

19. The method as described in clause 18, wherein an output of each flipflop of the series-connected flipflops enables at least one of the unit delay elements when the binary value has been propagated to the output of the each flipflop.

20. The method as described in any of clauses 14-19, wherein the multibit output of the counter is captured when the delay loop is operated in a first mode of operation and wherein a comparator is included in the delay loop when the delay loop is operated in a second mode of operation.

As used herein, a phrase referring to "at least one of" a list of items refers to any combination of those items, including single members. As an example, "at least one of: a, b, or c" is intended to cover a, b, c, a-b, a-c, b-c, and a-b-c, as well as any combination with multiples of the same element (e.g., a-a, a-a-a, a-a-b, a-a-c, a-b-b, a-c-c, b-b, b-b-b, b-b-c, c-c, and c-c-c or any other ordering of a, b, and c).

The present disclosure is provided to enable any person skilled in the art to make or use aspects of the disclosure. Various modifications to the disclosure will be readily apparent to those skilled in the art, and the generic principles defined herein may be applied to other variations without departing from the spirit or scope of the disclosure. Thus, the disclosure is not intended to be limited to the examples and designs described herein, but is to be accorded the widest scope consistent with the principles and novel features disclosed herein.

What is claimed is:

1. A calibration circuit comprising:
    a delay loop that includes a delay circuit;
    a counter that is clocked by edges in a clock signal generated by the delay loop when an enable signal is in a first signaling state; and
    a latch configured to capture a multibit output of the counter when the enable signal transitions to a second signaling state,
    wherein a number of unit delay elements in the delay circuit are enabled based on the multibit output of the counter.

2. The calibration circuit of claim 1, wherein the multibit output of the counter is used to configure an associated delay circuit in a clock generation loop of an analog-to-digital converter.

3. The calibration circuit of claim 1, wherein the number of enabled unit delay elements is based on a difference between the multibit output of the counter and a multibit value expected to be generated when the delay circuit is operating nominally.

4. The calibration circuit of claim 1, further comprising:
    combinational logic that is configured to enable combinations of the unit delay elements based on bit values in the multibit output of the counter.

5. The calibration circuit of claim 4, wherein the counter comprises:
    series-connected flipflops, wherein each flipflop of the series-connected flipflops provides one bit of the multibit output of the counter, and wherein a binary value is propagated through one of the series-connected flipflops in response to each edge in the clock signal.

6. The calibration circuit of claim 5, wherein an output of each flipflop of the series-connected flipflops enables at least one of the unit delay elements when the binary value has been propagated to the output of the each flipflop.

7. The calibration circuit of claim 1, wherein the multibit output of the counter is captured when the delay loop is operated in a first mode of operation and wherein a comparator is included in the delay loop when the delay loop is operated in a second mode of operation.

8. The calibration circuit of claim 7, wherein an operating characteristic of the comparator is configured based on the multibit output of the counter.

9. An apparatus comprising:
    means for counting cycles of a clock signal generated by a delay loop that includes a delay circuit, including series-connected flipflops clocked by edges in the clock signal, each flipflop of the series-connected flipflops providing one bit of a multibit output; and
    means for capturing the multibit output,
    wherein a number of unit delay elements in the delay circuit are enabled based on the multibit output.

10. The apparatus of claim 9, wherein a corresponding number of unit delay elements delay circuit in an associated clock generation loop provided in an analog-to-digital converter is enabled based on the multibit output.

11. The apparatus of claim 9, further comprising:
    combinational logic that is configured to enable combinations of the unit delay elements based on bit values in the multibit output.

12. The apparatus of claim 9, wherein the multibit output is captured when the delay loop is operated in a first mode of operation and wherein a comparator is included in the delay loop when the delay loop is operated in a second mode of operation.

13. The apparatus of claim 12, wherein an operating characteristic of the comparator is configured based on the multibit output of the counter.

14. A calibration method comprising:
    clocking a counter using edges in a clock signal generated by a delay loop that includes a delay circuit when an enable signal is in a first signaling state;
    capturing a multibit output of the counter when the enable signal transitions to a second signaling state; and
    enabling a number of unit delay elements in the delay circuit based on the multibit output of the counter.

15. The method of claim 14, comprising:
    configuring an associated delay circuit in a clock generation loop of an analog-to-digital converter based on the multibit output of the counter.

16. The method of claim 14, wherein the number of enabled unit delay elements is based on a difference between the multibit output of the counter and a multibit value expected to be generated when the delay circuit is operating nominally.

17. The method of claim 14, further comprising:
    enabling combinations of the unit delay elements based on bit values in the multibit output of the counter.

18. The method of claim 17, wherein the counter comprises series-connected flipflops, wherein each flipflop of the series-connected flipflops provides one bit of the multibit output of the counter, and wherein a binary value is propagated through one of the series-connected flipflops in response to each edge in the clock signal.

19. The method of claim 18, wherein an output of each flipflop of the series-connected flipflops enables at least one of the unit delay elements when the binary value has been propagated to the output of the each flipflop.

20. The method of claim 14, wherein the multibit output of the counter is captured when the delay loop is operated in a first mode of operation and wherein a comparator is included in the delay loop when the delay loop is operated in a second mode of operation.

* * * * *